United States Patent
Park

(10) Patent No.: US 10,460,813 B2
(45) Date of Patent: Oct. 29, 2019

(54) NONVOLATILE MEMORY DEVICES PROVIDING REDUCED DATA LINE LOAD

(71) Applicant: Samsung Electronics Co., Ltd., Suwon-si, Gyeonggi-do (KR)

(72) Inventor: Jeung-hwan Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/900,023

(22) Filed: Feb. 20, 2018

(65) Prior Publication Data

US 2018/0277225 A1    Sep. 27, 2018

(30) Foreign Application Priority Data

Mar. 22, 2017 (KR) .................. 10-2017-0036192

(51) Int. Cl.
| | |
|---|---|
| *G11C 16/24* | (2006.01) |
| *G11C 11/56* | (2006.01) |
| *G11C 16/04* | (2006.01) |
| *H01L 27/1157* | (2017.01) |
| *H01L 27/11582* | (2017.01) |
| *G11C 7/12* | (2006.01) |
| *H01L 27/11573* | (2017.01) |

(52) U.S. Cl.
CPC .......... *G11C 16/24* (2013.01); *G11C 11/5621* (2013.01); *G11C 11/5671* (2013.01); *G11C 16/0483* (2013.01); *G11C 7/12* (2013.01); *H01L 27/1157* (2013.01); *H01L 27/11573* (2013.01); *H01L 27/11582* (2013.01)

(58) Field of Classification Search
CPC ..... G11C 16/24; G11C 16/30; G11C 11/5621; G11C 11/5671; G11C 16/0483; G11C 7/12; H01L 27/11573; H01L 27/1157; H01L 27/11582
See application file for complete search history.

(56) References Cited

U.S. PATENT DOCUMENTS

| | | |
|---|---|---|
| 6,717,861 B2 * | 4/2004 | Jeong .................... G11C 16/10 365/185.17 |
| 7,085,159 B2 | 8/2006 | Cernea |
| 7,190,618 B2 | 3/2007 | Byeon |
| 7,679,966 B2 | 3/2010 | Kang et al. |
| 7,741,717 B2 | 6/2010 | Hong et al. |

(Continued)

FOREIGN PATENT DOCUMENTS

KR    1020100076749 A    7/2010

*Primary Examiner* — David Lam
(74) *Attorney, Agent, or Firm* — Myers Bigel, P.A.

(57) ABSTRACT

A nonvolatile memory device according to some embodiments of the inventive concepts may include a memory cell array, a first page buffer connected to the memory cell array via a first plurality of bit lines, and a second page buffer connected to the memory cell array via a second plurality of bit lines. The first page buffer circuit may include a first bit line selection circuit, a first bit line shut-off circuit, and a first latch circuit. The second page buffer may include a second bit line selection circuit, a second bit line shut-off circuit, and a second latch circuit. The first and second bit line selection circuits, the first and second bit line shut-off circuits, and the first and second latch circuits may be sequentially arranged in a direction away from the memory cell array. A width of the data lines may be greater than a width of the bit lines.

20 Claims, 13 Drawing Sheets

(56) References Cited

U.S. PATENT DOCUMENTS

| | | |
|---|---|---|
| 8,040,726 B2 | 10/2011 | Kwak |
| 8,879,351 B2 | 11/2014 | Kim |
| 9,336,888 B2 | 5/2016 | Heo |
| 2007/0147120 A1 | 6/2007 | Kim |

* cited by examiner

NONVOLATILE MEMORY DEVICES PROVIDING REDUCED DATA LINE LOAD

CROSS-REFERENCE TO RELATED APPLICATION

This application claims priority under 35 U.S.C. § 119 to Korean Patent Application No. 10-2017-0036192, filed in the Korean Intellectual Property Office on Mar. 22, 2017, the entire contents of which are9 hereby incorporated herein by reference.

BACKGROUND

Embodiments of the inventive concepts relate to nonvolatile memory devices, and more particularly, to nonvolatile memory devices including page buffer circuits for programming and reading data stored in memory cells.

Semiconductor memory devices are memory devices that may include a semiconductor such as, for example, silicon (Si), germanium (Ge), gallium arsenide (GaAs), and/or indium phosphide (InP). Some semiconductor memory devices may be categorized as volatile memory devices or nonvolatile memory devices.

A nonvolatile memory device is a memory device whose stored data may be saved when a power supply is turned off. Examples of nonvolatile memory devices include ROM, PROM, EPROM, EEPROM, flash memory devices, PRAM, MRAM, RRAM, and FRAM. Flash memory devices may be mainly divided into those of a NOR type and a NAND type.

Examples of devices using nonvolatile memory include an MP3 player, a digital camera, a mobile phone, a camcorder, a flash card, and a Solid-State Disk (SSD). As the use of nonvolatile memory as devices for storage has widened, capacity of nonvolatile memory has rapidly increased.

SUMMARY

Embodiments of the inventive concepts may provide nonvolatile memory devices having reduced load to a plurality of data lines.

According to some embodiments of the inventive concepts, nonvolatile memory devices are provided. A nonvolatile memory device may include a memory cell array, a first page buffer connected to the memory cell array via a first plurality of bit lines, and a second page buffer connected to the memory cell array via a second plurality of bit lines. The first page buffer circuit may include a first bit line selection circuit connected to the first plurality of bit lines, a first bit line shut-off circuit connected to the first plurality of bit lines via the first bit line selection circuit, and a first latch circuit configured to, input and output data via a first data line. The second page buffer may include a second bit line selection circuit connected to the second plurality of bit, lines, a second bit line shut-off circuit connected to the second plurality of bit lines via the second bit line selection circuit, and a second latch circuit configured to input and output data via a second data line. The first bit line selection circuit and the second bit line selection circuit may be on a first region of a main surface of a substrate, the first bit line shut-off circuit and the second bit line shut-off circuit may be on a second region of the main surface of the substrate, and the first latch circuit and the second latch circuit may be on a third region of the main surface of the substrate. The first region, the second region, and the third region may be sequentially arranged on the main surface of the substrate in a direction away from the memory cell array. A width of the first data line and, a width of the second data line may each be greater than a width of each of the first plurality of bit lines and a width of each of the second plurality of bit lines.

According to some embodiments of the inventive concepts, nonvolatile memory devices are provided. A nonvolatile memory device may include a memory cell array, a first page buffer connected to the memory cell array via a first plurality of bit lines, and a second page buffer connected to the memory cell array via a second plurality of bit lines. The first page buffer may include a first high-voltage circuit connected to the first plurality of bit lines, a first low-voltage circuit connected to the first plurality of bit lines via the first high-voltage circuit, and a first latch circuit configured to input and output data via a first data line. The second page buffer may include a second high-voltage circuit connected to the second plurality of bit lines, a second low-voltage circuit connected to the second plurality of bit lines via the second high-voltage circuit, and a second latch circuit configured to input and output data via a second data line. The first high-voltage circuit and the second high-voltage circuit may be on a first region of a main surface of a substrate, the first low-voltage circuit and the second low-voltage circuit may be on a second region of the main surface of the substrate, and the first latch circuit and the second latch circuit may be on a third region of the main surface of the substrate. The first region, the second region, and the third region may be sequentially arranged on the main surface of the substrate in a direction away from the memory cell array. The first high-voltage circuit and the second high-voltage circuit may be configured to receive respective voltages comprising higher ranges than voltages that the first low-voltage circuit and the second low-voltage circuit are configured to receive.

According to some embodiments of the inventive concepts, nonvolatile memory devices are provided. A nonvolatile memory device may include a memory cell array and a page buffer circuit including a plurality of high-voltage circuits, a plurality of low-voltage circuits, and a plurality of latch circuits on a substrate. The substrate may include a high-voltage region in which the high-voltage circuits are arranged, a low-voltage region in which the low-voltage circuits are arranged, and latch region in which the latch circuits are arranged. The high-voltage region, the low-voltage region, and the latch region may be sequentially arranged on a main surface of the substrate in a direction away from the memory cell array. A plurality of bit line patterns may be fanned on the high-voltage region and the low-voltage region. A plurality of data line patterns may be formed on the high-voltage region and the latch region. Widths of the plurality of data line patterns may be greater than widths of the bit line patterns.

BRIEF DESCRIPTION OF THE DRAWINGS

Embodiments of the inventive concepts may be more clearly understood from the following detailed description taken in conjunction with the accompanying drawings.

DETAILED DESCRIPTION OF THE EMBODIMENTS

Figure 1:
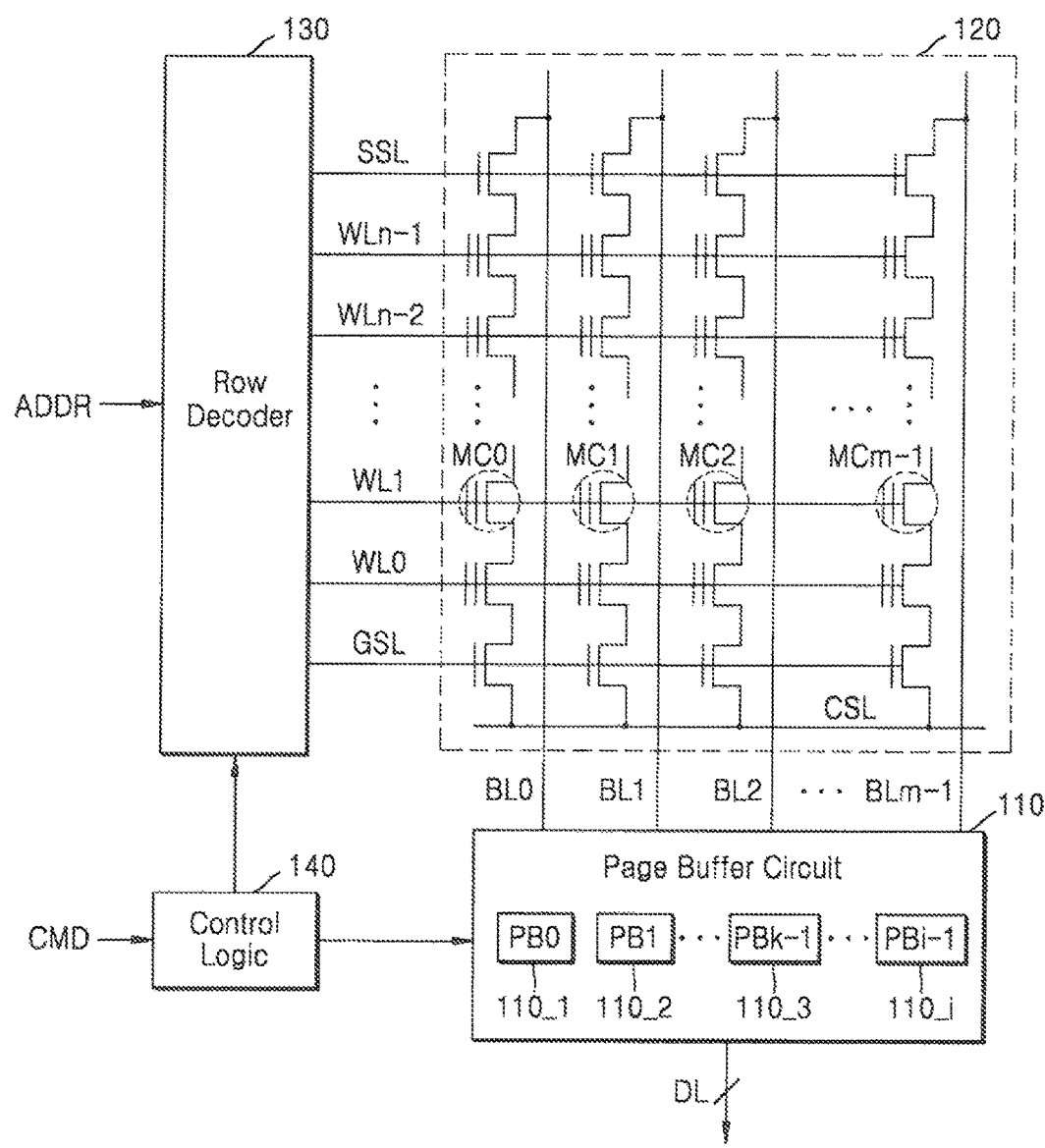
FIG. 1 is a block diagram illustrating a nonvolatile memory device according to some embodiments of the inventive concepts.

The inventive concepts will be described more fully hereinafter with reference to accompanying drawings, in which exemplary embodiments of the inventive concepts are shown. The embodiments of the inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

As used herein, the singular terms "a," "an" and "the" are intended to include the plural forms as well unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the tetras "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or, substrate is referred to as being "connected to" or "on" another element, it can be directly connected to or on the other element or intervening elements may be present. In contrast, the tens "directly" means that there are no intervening elements. Additionally, embodiments that are described in the detailed description may be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Embodiments of the present inventive concepts explained and illustrated herein may include their complementary counterparts. The same reference numerals or the same reference designators denote the same elements throughout the specification.

FIG. 1 is a block diagram illustrating a nonvolatile memory device, according to some embodiments of the inventive concepts.

Referring to FIG. 1, a nonvolatile memory device 10 may include a page buffer circuit 110, a memory cell array 120, a row decoder 130, and a control logic 140. For example, the nonvolatile memory device 10 is described as a flash memory device, but the inventive concepts are not limited thereto. It should be understood that the inventive concepts may apply to other types of nonvolatile memory device (e.g., Read-Only Memory (ROM), Programmable Read Only Memory (PROM), Erasable Programmable Read-Only Memory (EEPROM), Phase Change Random-Access Memory (PRAM), Magnetic Random-Access Memory (MRAM), Resistance Random-Access Memory (RR.AM), Ferroelectric Random-Access Memory (FRAM)).

The page buffer circuit 110 may perform operations of a light driver or a detection amplifier depending on an operation mode. During a program operation, the page buffer circuit 110 may transfer a bit line voltage corresponding to data to be programmed to a plurality of bit lines BL0 to BLm-1 in the memory cell array 120. During a read operation, the page buffer circuit 110 may detect data stored in a selected memory cell via the bit lines BL0 to BLm-1.

The page buffer circuit 110 may latch the detected data for output external to the nonvolatile memory device 10. The page buffer circuit 110 may be connected to a plurality of data lines DL so that data may be input and output via the data lines DL.

The page buffer circuit 110 may include a plurality of page buffers 110_1, 110_2, 110_3, and/or 110_j. Here, i may be a natural number equal to or greater than 3. Each of the page buffers 110_1, 110_2, 110_3, and/or 110_i may be connected to one or more of the bit lines BL0-BLm-1.

Ones of the page buffers 110_1, 110_2, 110_3 and 110_i may each respectively include a high-voltage circuit, a low-voltage circuit, and a latch circuit. In some embodiments, a high-voltage circuit may include a bit line selection circuit that is embodied as a high-voltage transistor, the low voltage circuit may include a bit line shut-off circuit for performing a shut-off operation of bit lines and a bit line discharge circuit for discharging bit lines embodied as low-voltage circuits. However, embodiments are not limited thereto. For example, a bit line discharge circuit for discharging bit lines may be embodied as a high-voltage transistor and be included in a high-voltage circuit. In some embodiments, a voltage applied to a high-voltage circuit may have a greater range than a voltage applied to a low-voltage circuit.

The bit line selection circuit may be connected to internal bit lines, and the bit line shut-off circuit and the bit line selection circuit may be connected to each other via the internal bit lines. The latch circuit may be connected to data lines that may carry information required to perform a program operation or a read operation. The page buffer circuit 110 will be described in more detail with reference to FIG. 2.

The memory cell array 120 may be connected to the row decoder 130 via word lines WL0 to WLn-1, a cell string selection line SSL, and a ground selection line GSL. The memory cell array 120 may be connected to the page buffer circuit 110 via the bit lines BL0 to BLm-1. The memory cell array 120 may include, for example, a plurality of NAND cell strings. Each of the cell strings may be connected to a bit line via a cell string selection transistor SST. The memory cell array 120 may include a plurality of memory cells comprising each NAND cell string. However, embodiments are not limited thereto, and in some embodiments the memory cell array 120 may include, for example, NOR cells instead of NAND cells.

A plurality of memory cells may be programmed, erased, and read by bit line voltages and word line voltages. In some embodiments, each of the memory cells may be configured to be a multi-level cell MLC that stores at least 2 bits of data in one memory cell.

The memory cell array 120 may be configured as a plurality of planes, each of the planes including a plurality of memory blocks, and the memory blocks may be configured as a plurality of pages. Each of the pages may include a plurality of memory cells.

In some embodiments of the inventive concepts, a two-dimensional (2D) memory array or a three-dimensional (3D) memory array may be provided. The 3D memory array may include an active region disposed on a silicon substrate and a circuit associated with operation of memory cells, and may be formed in a monolithic form in at least one physical level of memory cell arrays having a circuit formed on or in the silicon substrate. As used herein, the expression "monolithic" may refer to each layer of levels constituting the 3D memory array being stacked directly on another layer of the levels at a tower level. The memory cell array 120 will be described below in more detail with reference to FIGS. 7 to 9.

The row decoder 130 may select a memory block of the memory cell array 120 in response to an address ADDR. The row decoder 130 may select a word line of the selected memory block. The row decoder 130 may transfer a word line voltage from a voltage generator to the selected word line of the selected memory block.

The control logic 140 may receive a program command CMD, and in response to the program command CMD, may output various control signals for controlling the page buffer circuit 110 and the row decoder 130 to perform a program operation.

Figure 2:
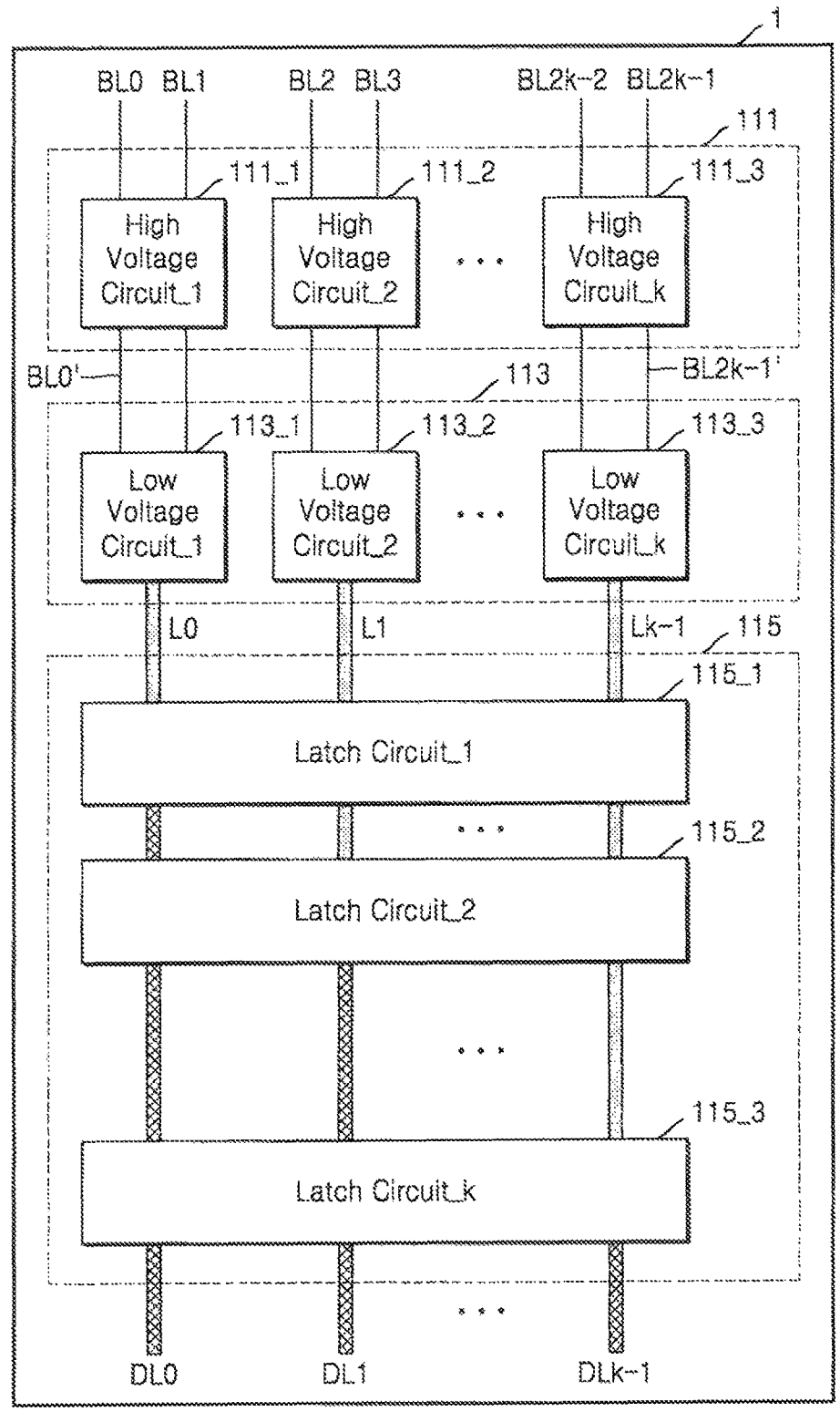
FIG. 2 is a block diagram illustrating a page buffer circuit included in a nonvolatile memory device, according to some embodiments of the inventive concepts.

FIG. 2 is a block diagram illustrating a page buffer circuit included in a nonvolatile memory device, according to some embodiments of the inventive concepts. FIG. 2 illustrates at least a portion of the page buffer circuit 110, including the page buffers 110_1 to 110_1, described with respect to FIG. 1.

Referring to FIGS. 1 and 2, a page buffer circuit 110a may include first to kth page buffers 110_1, 110_2, and 110_3. Here, k may be a natural number equal to or greater than 3, and may be a natural number equal to or less than i of FIG. 1. The first page buffer 110_1 may include a first high-voltage circuit 111_1, a first low-voltage circuit 113_1 and a first latch circuit 115_1. The second page butler 110_2 may include a second high-voltage circuit 111_2, a second low-voltage circuit 113_2, and a second, latch circuit 115_2, and a kth page buffer 110_3 may include a kth high-voltage circuit 111_3, a kth low-voltage circuit 113_3, and a kth latch circuit 115_3.

The first. high-voltage circuit 111_1 of the first page buffer 110_1 may be connected to a first bit line BL0 and a second bit line BL1 . The first low-voltage circuit 113_1 may be connected to the first high-voltage circuit 111_1 via a first connection bit line BL0' and a second connection bit line BL1'. The first low-voltage circuit 113_1 and the first latch circuit 115_1 may be connected to each other via a first connection line L0. The first latch circuit 115_1 may input and output data via a first data line DL0.

Each of the first to kth page buffers 110_1, 110_2 and 110_3 may be simultaneously connected to a plurality of bit lines. For example, each of the first to kth page buffers 110_1, 110_2, and 110_3 may have a shield bit line structure, In FIG. 2, it is illustrated that each of the first to kth page buffers 110_1, 110_2, and 110_3 is connected to two bit lines, however embodiments of the inventive concepts are not limited thereto. For example, in some embodiments, each page buffer may be connected to four or more bit lines, and detailed descriptions thereof will be provided with reference to FIGS. 11 and 12.

A high voltage circuit unit 111 may include the first to kth high-voltage circuits 111_1, 111_2, and 111_3. A low-voltage circuit unit 113 may include the first to kth low-voltage circuits 113_1, 113_2, and 113_3. A latch circuit unit 115 may include the first to kth latch circuits 115_1, 115_2, and 115_3. The high-voltage circuit unit 111, the low-voltage circuit unit 113, and the latch circuit unit 115 may be sequentially disposed on a main surface of a substrate 1 in a direction away from the memory cell array 120. The first to kth latch circuits 115_1, 115_2, and 115_3 included in the latch circuit unit 115 may also be sequentially disposed on the main surface of the substrate 1 in a direction away from the memory cell, array 120.

The high-voltage circuit unit 111 may be embodied as a plurality of high-voltage transistors, and the low-voltage circuit unit 113 may be embodied as a plurality of low-voltage transistors. A voltage applied to the high-voltage transistors may have a greater range than a voltage applied to the low-voltage transistors. Accordingly, the level of the maximum voltage applied to the high-voltage transistor may be higher than the level of the maximum voltage applied to the low-voltage transistor.

In comparison to embodiments wherein the first low-voltage circuit 113_1, the first latch circuit 115_1, the second low-voltage circuit 113_2, the second latch circuit 115_2, the kth low-voltage circuit 113_3 and the kth latch circuit 115_3 are sequentially disposed, a nonvolatile memory device according to some embodiments of the inventive concepts may have the low-voltage circuit unit 113 including the first to kth low-voltage circuits 113_1, 113_2, and 113_3 that may be disposed relatively close to the memory cell array 120, and may also be disposed close to the high-voltage circuit unit Ill. Accordingly, a plurality of bit lines BL0 to BL2k-1 and a plurality of connection bit lines BL0' to BL2k-1' may extend from the memory cell array 120 only until the low-voltage circuit unit 113, and a plurality of connection lines L0 to Lk-1 and a plurality of data lines DL0 to DLk-1 that connect the low voltage circuit unit 113 and the first to kth latch circuits 115_1, 115_2, and 115_3, may be formed separately.

Even when the bit lines BL0 to BL2k-1 connected to the memory cells included in the memory cell array 120 are each formed to have a relatively small width, widths of each of the connection lines L0 to Lk-1 and the data lines DL0 to DLk-1 may be greater than the width of the bit lines BL0 to BL2k-1. In this regard, a load to the data lines DL0 to DLk-1 may be reduced. Also, a dump time for storing data in the latch circuit unit 115 may be reduced, and an operational performance f the page buffer circuit 110 may be improved.

Figure 3:
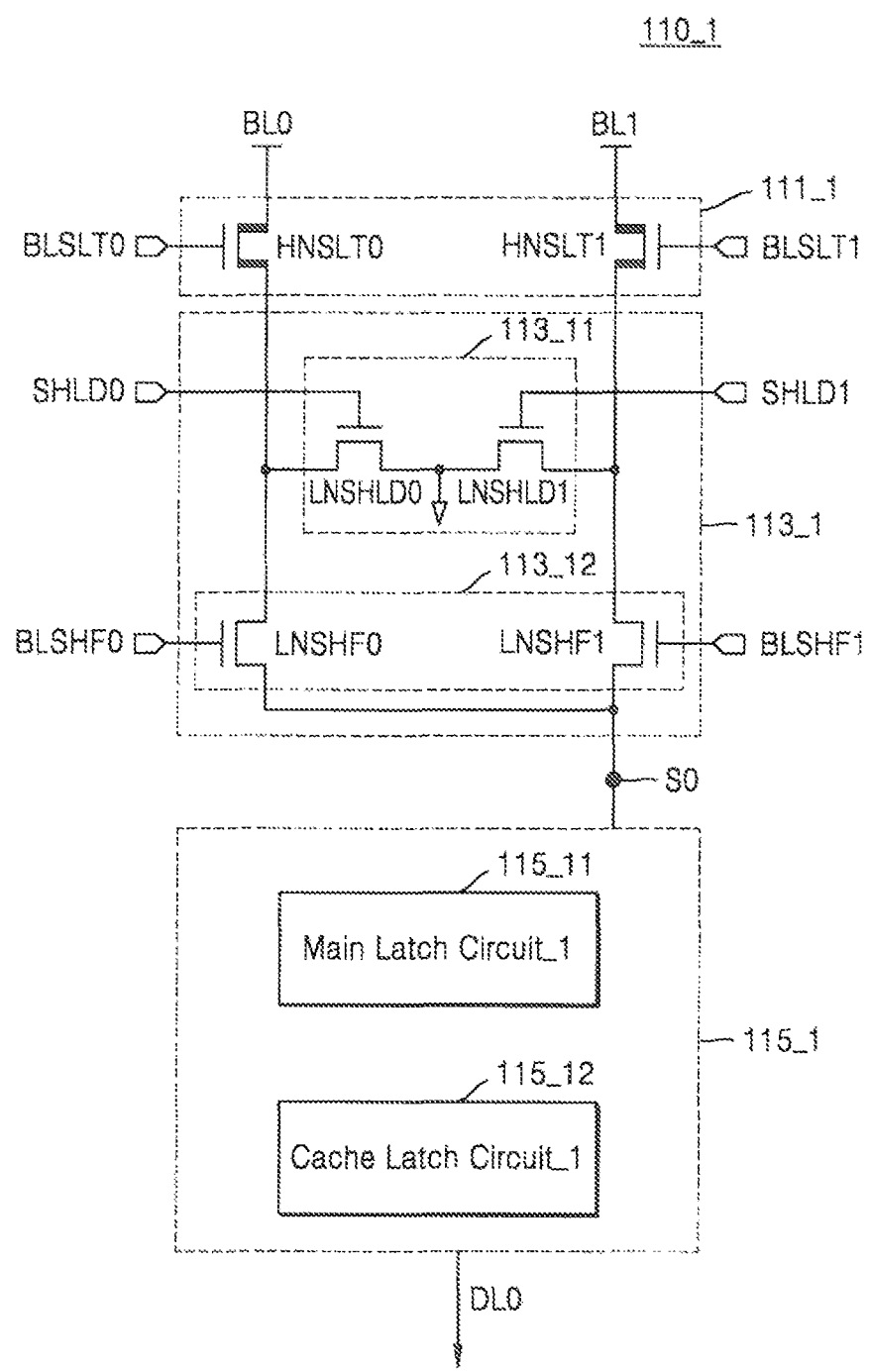
FIG. 3 is a block diagram illustrating a structure of the first page buffer of FIG. 1, according to some embodiments of the inventive concepts.

FIG. 3 is a block diagram illustrating a structure of the first page buffer of FIG. 1, according to some embodiments of the inventive concepts.

Referring to FIGS. 2 and 3, the first page buffer 110_1 may include the first high-voltage circuit 111_1, the first low-voltage circuit 113_1, and the first latch circuit 115_1. The first page buffer 110_1 may be connected to two bit lines, specifically, the first bit line BL0 and the second bit line BL1.

The first high-voltage circuit 111_1 may include a bit line selection circuit including bit line selection transistors HNSLT0 and HNSLT1. In some embodiments, a bit line selection circuit may include two bit line selection transistors HNSLT0 and HNSLT1 corresponding to the first bit line BL0 and the second bit line BL1 that are connected to the first high-voltage circuit 111_1. The first high-voltage circuit 111_1 may include circuits embodied as high-voltage transistors other than the bit line selection circuit.

The first bit line BL0 and the second bit line BL1 may be respectively a set-up bit line that is a target of a program operation and a shield bit line that is not a target of a program operation. The bit line selection circuit may set one of the first bit line BL0 and the second bit line BL1 as a set-up bit line, based on a first bit line selection signal BLSLT0 and a second bit line selection signal BLSLT1. When a program operation for the set-up bit line is completed, the bit line selection circuit may sequentially set another bit line as the set-up bit line to perform another program operation. Although it is illustrated that two bit lines are connected to the first page buffer 110_1 in FIG. 3, embodiments are not limited thereto. The number of bit lines connected to the first page buffer 110_1 may vary. The number of bit line selection transistors included in the first high-voltage circuit 111_1 may vary depending on the number of bit lines connected to the first page buffer 110_1.

The first low-voltage circuit 113_1 may include a bit line discharge circuit 113_11 and a bit line shut-off circuit 113_12. The first low-voltage circuit 113_1 may also include circuits embodied as low-voltage transistors in addition to the bit line discharge circuit 113_11 and the bit line shut-off circuit 113_12.

The bit line discharge circuit 113_11 may include two discharge transistors LNSHLD0 and LNSHLD1 corresponding to the first, connection bit line BL0' and the second connection bit line BL1' that are connected to the bit line discharge circuit 113_11. The discharge transistors LNSHLD0 and LNSHLD1 may discharge the first bit line BL0 and the second bit line BL1, respectively, via the first connection bit line BL0' and the second connection bit line BL1', respectively, based on a first discharge signal SHLD0 and a second discharge signal SHLD1.

A bit line shut-off circuit 113_12 may include two shut-off transistors LNSHF0 and LNSHF1 corresponding to the first connection bit line BL0' and the second connection bit line BL1' that are connected to the bit line shut-off circuit 113_12. The shut-off transistors LNSHF0 and LNSHF1 may connect the fast bit line BL0 and the second bit line BL1, via the first connection bit line BL0' and the second connection bit line BL1', respectively, to a sensing node SO, respectively based on a first shut-off signal BLSHF0 and a second shut-off signal BLSHF1.

Although it is illustrated in FIG. 3 that the first low-voltage circuit 113_1 includes two discharge transistors and two shut-off transistors, embodiments are not limited thereto. The number of discharge transistors and shut-off transistors included in the first low-voltage circuit 113_1 may vary depending on the number of bit lines connected to the first page buffer 110_1.

The first low-voltage circuit 113_1 and the first latch circuit 115_1 are connected to each other via the sensing node SO, and a signal output from the first low-voltage circuit 113_1 may transit to the first latch circuit 115_1 via the sensing node SO.

The first latch circuit 115_1 may include a main latch circuit 115_11 and a cache latch circuit 115_12. The main latch circuit 115_11 and the cache latch circuit 115_12 may be connected to the sensing node SO.

The main latch circuit 115_11 may include at least one data latch and at least one sensing latch. The number of data latches included in the first latch circuit 115_1 may vary depending on the number of hits written in a memory cell included in the memory cell array 120. For example, when 2 bits of data are programmed in one memory cell, two data latches may be provided. The sensing latch may perform a sensing operation and temporally store sensing data based on electric potential of the sensing node SO. The sensing data stored in the sensing latch may be temporally stored in the data latch. The main latch circuit 115_11 may further include a plurality of transistors as well as at least one data latch and at least one sensing latch.

The cache latch circuit 115_12 may include a cache latch. The cache latch may temporally store input data provided from the outside. During a program operation, target data to be stored in the cache latch may be stored in the data latch of the main latch circuit 115_11. The cache latch circuit 115_12 may be connected to the first data line DL0 and receive or output data via the first data line DL0. The cache latch circuit 115_12 may further include a plurality of transistors as well as the cache latch.

In some embodiments, the main latch circuit 115_11 may be disposed between the first low-voltage circuit 113_1 and the cache latch circuit 115_12 on the main surface of the substrate 1. Here, a total length of the first data line DL0 connected to the cache latch circuit 115_12 may be relatively small, and the smaller the total length, the smaller a load to the first data line DL0 may be. However, embodiments are not limited thereto, and a disposition of the main latch circuit 115_11 and the cache latch circuit 115_12 may vary depending on routing of the first data line DL0.

Although only the first page buffer 110_1 is illustrated in FIG. 3, the description of the first page buffer 110_1 may also apply to the second to kth page buffers 110_2 to 110_3.

In a nonvolatile memory device according to some embodiments of the inventive concepts, the data lines DL0 to DLk-1 have a greater width than the bit lines BL0 to BL2k-1, and thus, a load to the data lines DL0 to DLk-1 is reduced. Accordingly, there may be less need to separately dispose a plurality of main latch circuits included in the first to kth page buffers 110_1 to 110_3 and a plurality of cache latch circuits included in the first to kth page buffers 110_1 to 110_3 to reduce a load to the data lines DL0 to DLk-1. In this regard, in the nonvolatile memory device according to some embodiments of the inventive concepts, the first to kth latch circuits 115_1 to 115_3 may be sequentially disposed on the main surface of the substrate 1, and thus, a total length corresponding to a disposition of the high-voltage circuit unit 111, the low-voltage circuit unit 113, and the latch circuit unit 115 may be reduced. As a result, integration of a nonvolatile memory device may be improved.

Figure 4:
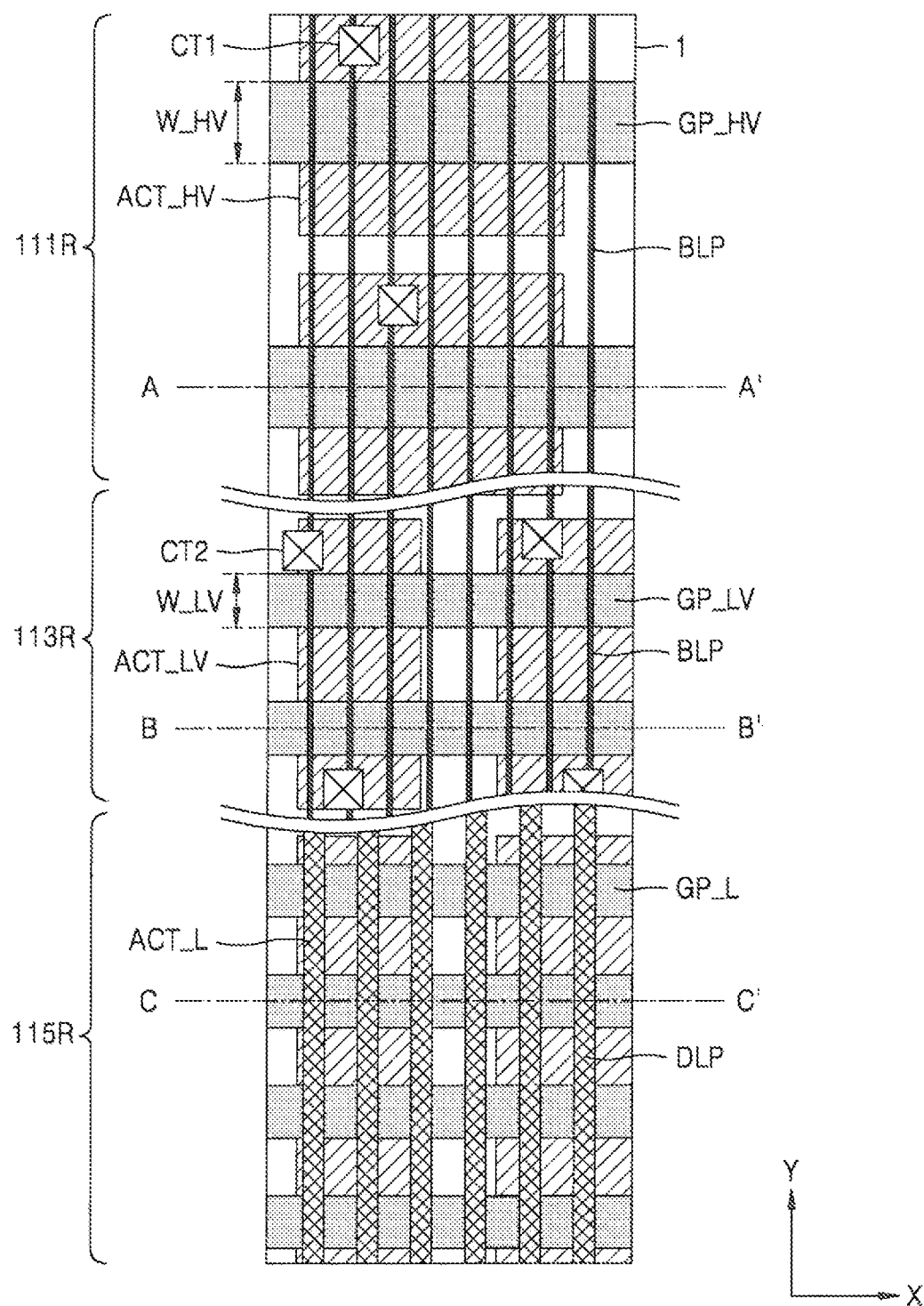
FIG. 4 is a plan view schematically illustrating a layout of a portion of the page buffer circuit of FIG. 2, according to some embodiments of the inventive concepts.

FIG. 4 is a plan view schematically illustrating a layout of a portion of the page buffer circuit of FIG. 2, according to some embodiments of the inventive concepts.

Referring to FIGS. 2 and 4, the page buffer circuit 110 may include the-high-voltage circuit unit 111, the low-voltage circuit unit 113, and the latch circuit unit 115. The high-voltage circuit unit 111, the low-voltage circuit unit 113, and the latch circuit unit 115 may be respectively formed in a high-voltage circuit region 111R, a low-voltage circuit region 113R, and a latch region 115R of the substrate 1. The high-voltage circuit region 111R, the low-voltage circuit region 113R, and the latch region 115R of the substrate 1 may be sequentially disposed.

The high-voltage circuit region 111R and the low-voltage circuit region 113R may have different wells. A well of the high-voltage circuit region 111R may have a greater depth than a well of the low-voltage circuit region 113R.

A plurality of active regions ACT_FTV may be in the high-voltage circuit region 111R. Each of the active regions ACT_HV may correspond to one bit line selection transistor. Each of the active regions ACT_HV may include a source region and a drain region doped with a first conductivity type impurity, and a channel region doped with a second conductivity type impurity.

A plurality of gate line patterns GP_HV may be on the channel regions of the active regions ACT_HV of the high-voltage circuit region 111R. The gate line patterns GP_HV may operate as gates of the bit line selection transistors. The gate line patterns GP_HV may extend primarily in a first direction (X), and the gate line patterns GP_HV may be spaced apart from each other in a second direction (Y). When a discharge transistor is embodied as a high-voltage transistor, the gate line patterns GP_HV may operate as a gate of a discharge transistor.

A plurality of bit line patterns BLP of the high-voltage circuit region 111R may be on an upper portion of the gate line patterns GP_HV, The bit line patterns BLP may extend primarily in the second direction (Y), and the bit line patterns BLP may be spaced apart from each other in the first direction (X). The bit line patterns BLP may be connected to the active regions ACT_HV via first contacts CT1. Some of the bit line patterns BLP may form the bit lines BL0 to BL2k-1 and/or the connection bit lines BL0' to BL2k-1'.

A plurality of active regions ACT_LV may be in the low-voltage circuit region 113R. Each of the active regions ACT_LV may include a source region and a drain region doped with a first conductivity type impurity and a channel region doped with a second conductivity type impurity. However, embodiments are not limited thereto. For example, Each of the active regions ACL_LV may include a source region and a drain region doped with the second conductivity type impurity, and a channel region doped with the first conductivity type impurity.

A plurality of gate, line patterns GP_LV may be on channel regions of the active regions ACT_LV of the low-voltage circuit region 113R. The gate line patterns GP_LV may each operate as a gate of, for example, a shut-off transistor or a discharge transistor. The gate line patterns GP_LV may extend in the first direction (X), and the gate line patterns GP_LV may be spaced apart from each other in the second direction (Y). However, embodiments are not limited thereto. For example, when a discharge transistor is embodied as, a high-voltage transistor, the discharge transistor may not be in the low-voltage circuit region 113R.

The bit line patterns BLP of the low-voltage circuit region 113R may be on an upper portion of the gate line, patterns GP_LV. The bit line patterns BLP may be connected to the active regions ACT_LV via second contacts CT2.

A high-voltage transistor may be in the high-voltage circuit region 111R, and a low-voltage transistor may be in the low-voltage circuit region 113R. Widths in the first direction (X) and the second direction (Y) of each of the active regions ACT_HV in the high-voltage circuit region 111R may be greater than widths in the first direction (X) and the second direction (Y) of each of the active regions ACT_LV in the low-voltage circuit region 113R. Widths W_HV of the gate line patterns GP_HV in the high-voltage circuit region 111R may be greater than widths W_LV of the gate line patterns GP_HV in the low-voltage circuit region 113R.

A plurality of active regions ACT_L may be in the latch region 115R. Each of the active regions ACT_L may include a source region and a drain region doped with a first conductivity type impurity, and a channel region doped with a second conductivity type impurities.

A plurality of gate line patterns GP_L may be on channel regions of the, active regions ACT_L in the latch region 115R. The gate line patterns GP_L may extend in the first direction (X), and the gate line patterns GP_L may be spaced apart from each other in the second direction (Y).

A plurality of data line patterns DLP may be on an upper portion of the gate line patterns GP_L. The data line patterns DLP may extend in the second direction (Y), and the data line patterns DLP may be spaced apart from each other in the first direction (X). Some of the data line patterns DLP may form the data lines DL0 to DLk-1.

Figure 5:
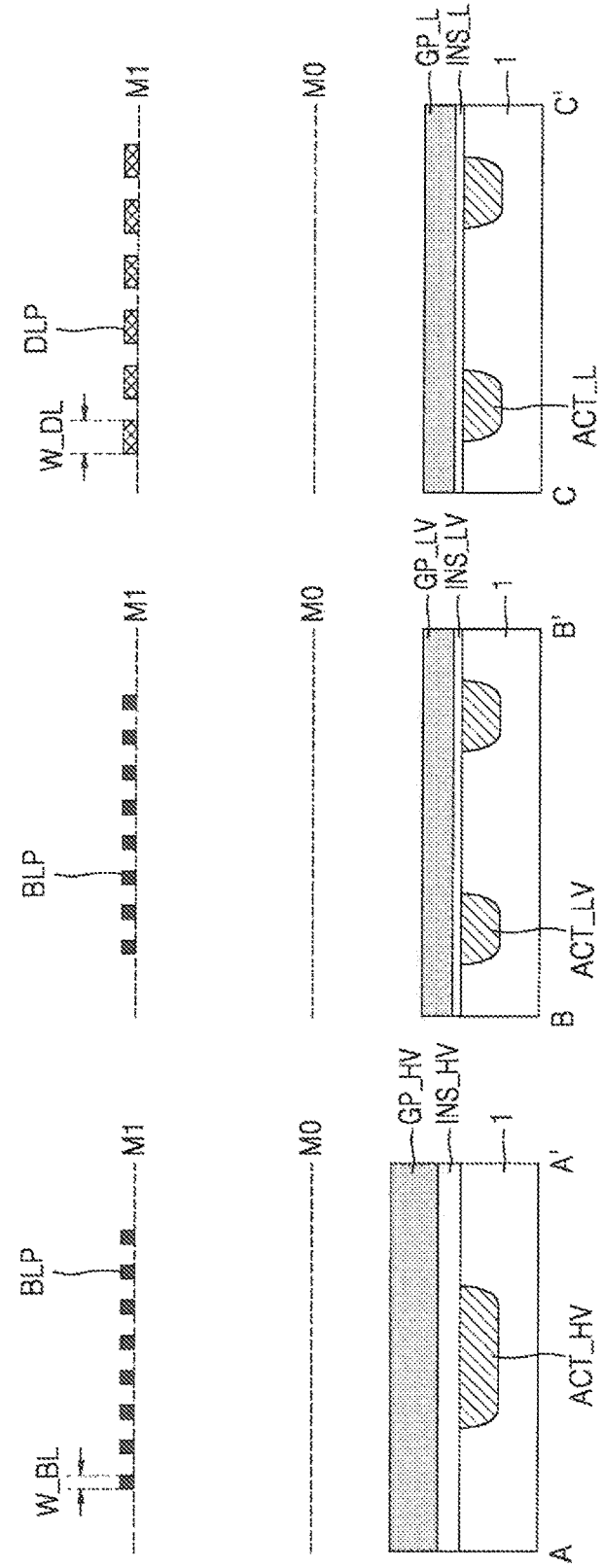
FIG. 5 is a cross-sectional view of the high-voltage circuit region, the low-voltage circuit region, and the latch region, respectively taken along lines A-A', B-B', and C-C' of FIG. 4, according to some embodiments of the inventive concepts.

FIG. 5 is a cross-sectional view of the high-voltage circuit region, the low-voltage circuit region, and the latch region, respectively taken along lines A-A', B-B', and C-C' of FIG. 4, according to some embodiments of the inventive concepts.

Referring to FIGS. 2, 4, and 5, the high-voltage circuit region 111R, the low-voltage circuit region 113R, and the latch region 115R of the substrate 1 may respectively include insulating layers INS_HV, INS_LV, and INS_L, and the gate patterns GP_HV, GP_LV, and GP_L may be respectively on the insulating layers INS_HV, INS_LV, and INS_L. The high-voltage circuit region 111R may include a high-voltage transistor, and the low-voltage circuit region 113R may include a low-voltage transistor. Thicknesses of a gate line pattern GP_HV and the insulating layer INS_HV in the high-voltage circuit region 111R may respectively be greater than thicknesses of a gate line pattern GP_IN and the insulating layer INS_LV in the low-voltage circuit region 113R.

A width W_DL, of the data line patterns DLP in the latch region 115R may be greater than a width W_BL of the bit line patterns BLP in the high-voltage circuit region 111R and the low-voltage circuit region 113R. In some embodiments, the bit line patterns BLP each having a relatively small width may be formed by a double patterning technology (DPT) or quadruple patterning technology (QPT) process, and the data line patterns DLP each having a relatively large width may be by a single patterning technology process. When the data line patterns DLP are by a single patterning technology process, time taken and a cost for forming a pattern may be reduced.

A plurality of layers, including a first layer M0 and a second layer M1, may be on the substrate 1, the plurality of layers including a plurality of conductive lines. The bit line patterns BLP and the data line patterns DLP may be disposed on the, same layer. For example, both the bit line patterns BLP and the data line patterns DLP may be disposed on the second layer M1.

A nonvolatile memory device according to some embodiments of the inventive concepts may include the high-voltage circuit region 111R, the low-voltage circuit region 113R, and the latch region 115R that are sequentially disposed on the substrate 1, and thus, the bit line patterns BLP may be in the high-voltage circuit region 111R and the low-voltage circuit region 113R and the data line patterns DLP may be in the latch region 115R. Accordingly, a space for forming the data line patterns DLP may be sufficiently secured, and a width of the data line patterns DLP may be relatively large. Also, the data line patterns DLP may not be required to be in a plurality of layers of the substrate 1, and may be in one layer. For example, as illustrated in FIG. 5, the data line patterns DLP may be disposed on the same layer as the bit line patterns BLP, that is, for example, on the second layer M1.

Accordingly, a load to the data lines DL0 to DLk-1 may be reduced, and the data line patterns DLP may not be in different layers of the substrate 1 but may be in one layer. As a result, a process of manufacturing the data lines DL0 to DLk-1 may be simplified.

Figure 6:
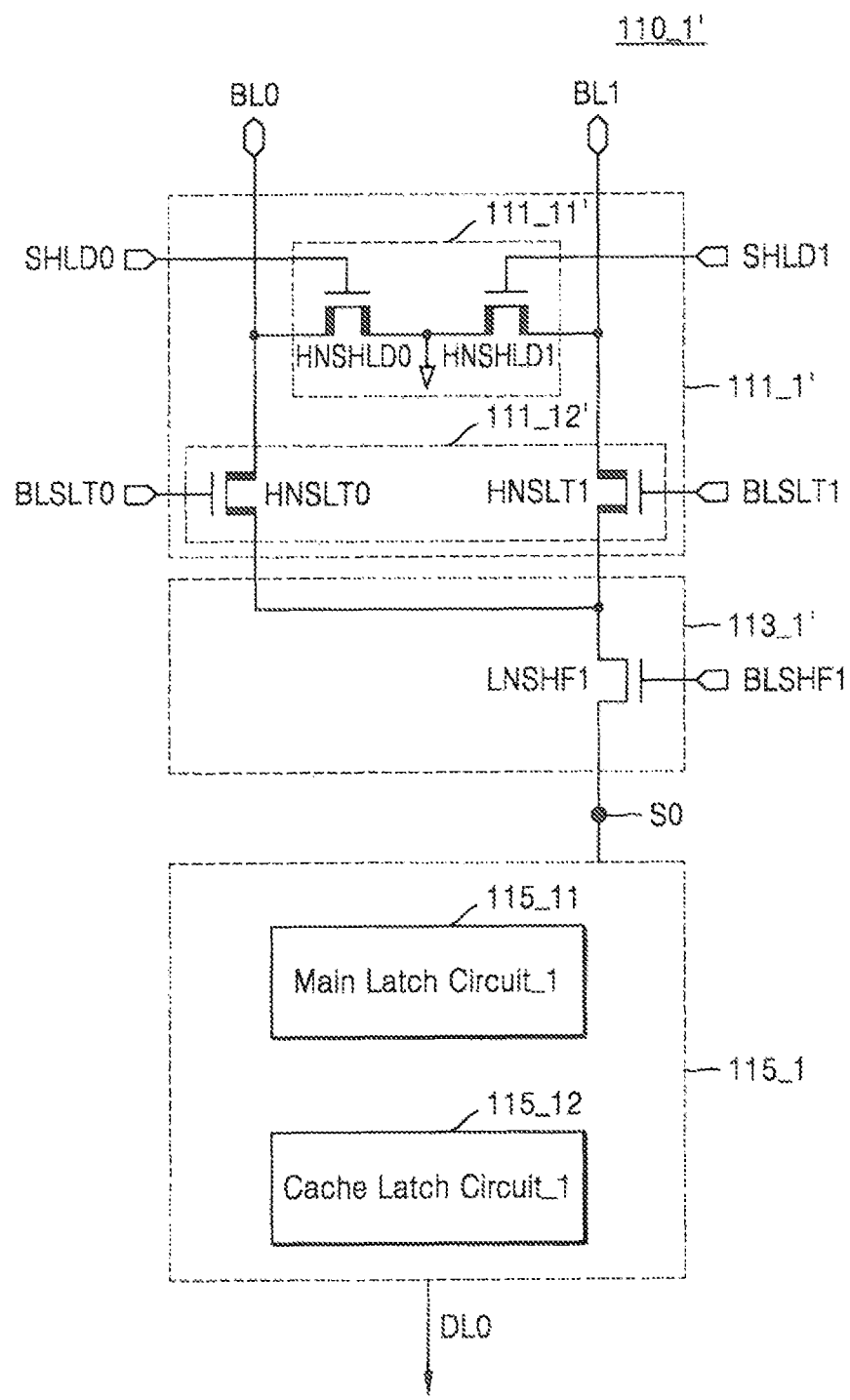
FIG. 6 is a block diagram illustrating the first page buffer of FIG. 1, according to some embodiments of the inventive concepts.

FIG. 6 is a block diagram illustrating the first page buffer of FIG. 1, according to some embodiments of the inventive concepts. A first page buffer 110_1' of FIG. 6 may include a bit line discharge circuit 111_11' embodied as a high-voltage transistor, unlike the first page buffer 110_1 of FIG. 3. The same reference numerals in FIGS. 3 and 6 refer to the same members, and thus, repeated descriptions thereof may be omitted.

Referring to FIGS. 2 and 6, the first page buffer 110_1' may include a first high-voltage circuit 111_1', a first low-voltage circuit 113_1', and the first latch circuit 115_1. The first page buffer 110_1' may be connected to two bit lines, that is, the first bit line BL0 and the second bit line BL1. Although it is illustrated in FIG. 6 that the number of bit lines connected to the first page buffer 110_1' is two, embodiments are not limited thereto.

The first high-voltage circuit 111_1' may include the bit line discharge circuit 111_11' and a bit line selection circuit 111_12'. The bit line discharge circuit 111_11' may include two discharge transistors HNSHLD0 and HNSHLD1 respectively corresponding to the first bit line BL0 and the second bit line BL1 connected to the bit line discharge circuit 111_11'. The discharge transistors HNSHLD0 and HNSHLD1 may respectively discharge the first bit line BL0 and the second bit line BL1, based respectively on a first discharge signal SHLD0 and a second discharge signal SHLD1.

The bit line selection circuit 111_12' may include two bit line selection transistors HLSLT0 and HLSLT1 respectively corresponding to the first bit line BL0 and the second bit line BL1. The bit line selection transistors HLSLT0 and HLSLT1 may set one of the first bit line BL0 and the second bit line BL1 as set-up bit line, respectively, based on the first bit line selection signal BLSLT0 and the second bit line selection signal BLSLT1.

Although it is illustrated in FIG. 6 that there are two discharge transistors and two bit line selection transistors included in the first high-voltage circuit 111_1', embodiments are not limited thereto. The number of discharge transistors and bit line selection transistors included in the first high-voltage circuit 111_1' may vary depending on the number of bit lines connected to the first page buffer 110_1'.

The first low-voltage circuit 113_1' may include a bit line shut-off circuit. The bit line shut-off circuit may include a shut-off transistor LNSHF1, and the shut-off transistor LNSHF1 may connect each of the first bit line BL0 and the second bit line BL1 to the sensing node SO, based on a shut-off signal BLSHF1.

The first low-voltage circuit 113_1' and the first latch circuit 115_1 may be connected to each other via the sensing node SO, and a signal output from the first low-voltage circuit 113_1' may be transmitted to the first latch circuit 115_1 via the sensing node SO. The first latch circuit 115_1 may include the main latch circuit 115_11 and the cache latch circuit 115_12.

In some embodiments, the main latch circuit 115_11 may be disposed between the first, low-voltage circuit 113_1' and the cache latch circuit 115_12. Here, a total length of the first data line DL0 connected to the cache latch circuit 11512 may be relatively short, and thus a load to the first data line DL0 may be reduced.

Although only the first page buffer 110 is illustrated in FIG. 6, the description of the first page buffer 110 may also be applied to other page buffers. Also, the page buffer circuit 110 of FIGS. 1 and 2 may include both the first page buffer 110_1 of FIG. 3 and the first page buffer 110_1' of FIG. 6.

Figure 7:
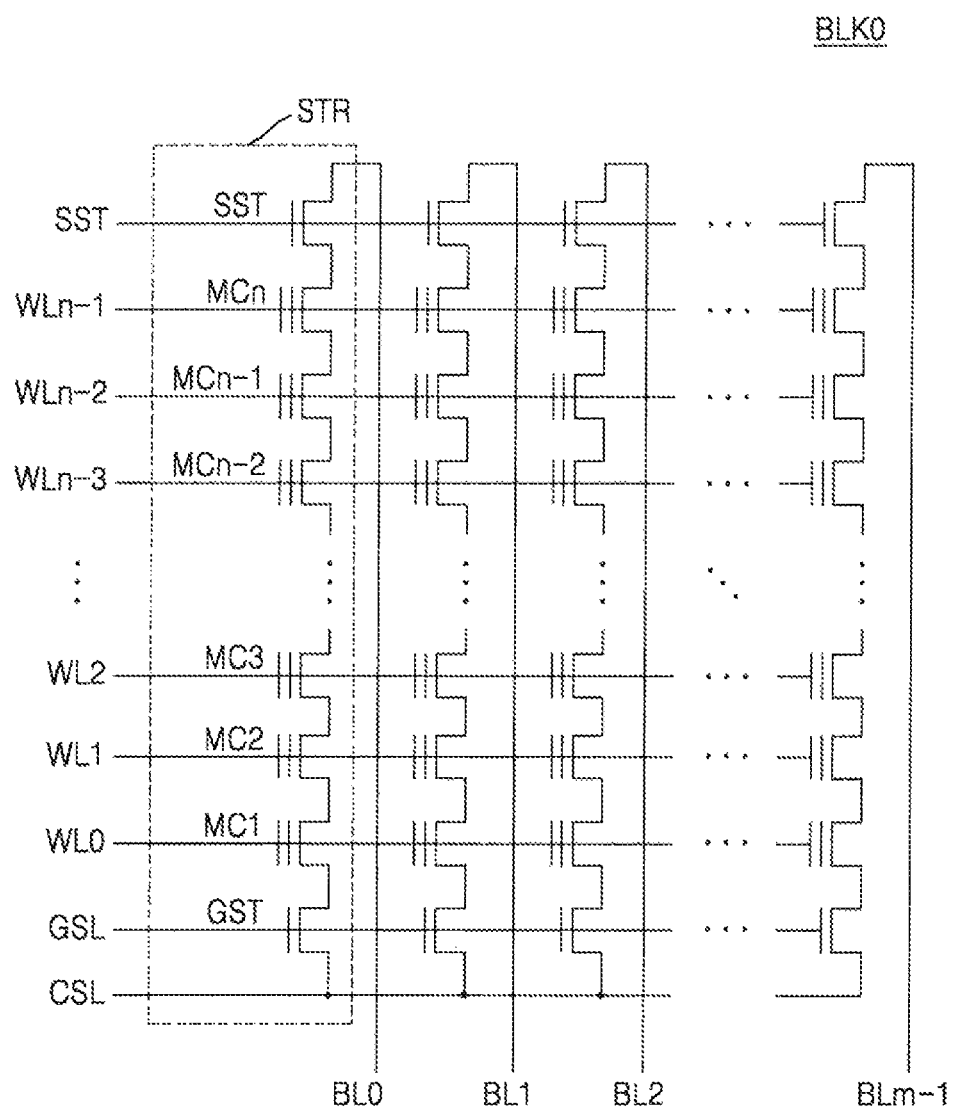
FIG. 7 is a schematic view illustrating a circuit diagram of a memory block according to some embodiments of the inventive concepts.

FIG. 7 a schematic view illustrating a circuit diagram of a memory block according to some embodiments of the inventive concepts.

Referring to FIG. 7, a memory cell array (for example, the memory cell array 120 of FIG. 1) may be a memory cell array of a horizontal NAND flash memory and may include a plurality of memory blocks, including a memory block BLK0. Each memory block BLK0 may include m cell strings STR (m being an integer equal to or greater than 2) in which a plurality of memory cells MC are connected in series in a direction of bit lines BL0 to BLm-1.

In a NAND flash memory device having a structure illustrated in FIG. 7, an erase operation may be performed in a block unit, and a program operation may be performed in a page unit PAGE corresponding to, each of world lines WL0 to WLn-1. In the NAND flash memory device illustrated in FIG. 7, n pages PAGE for n word lines WL0 to WLn-1 are provided in one block, Also, the nonvolatile memory device 10 of FIG. 1 may include a plurality of memory cell arrays having the same structure and performing the same operation as the memory cell array 120 described above including the memory block BLK0 illustrated in FIG. 7.

Figure 8:
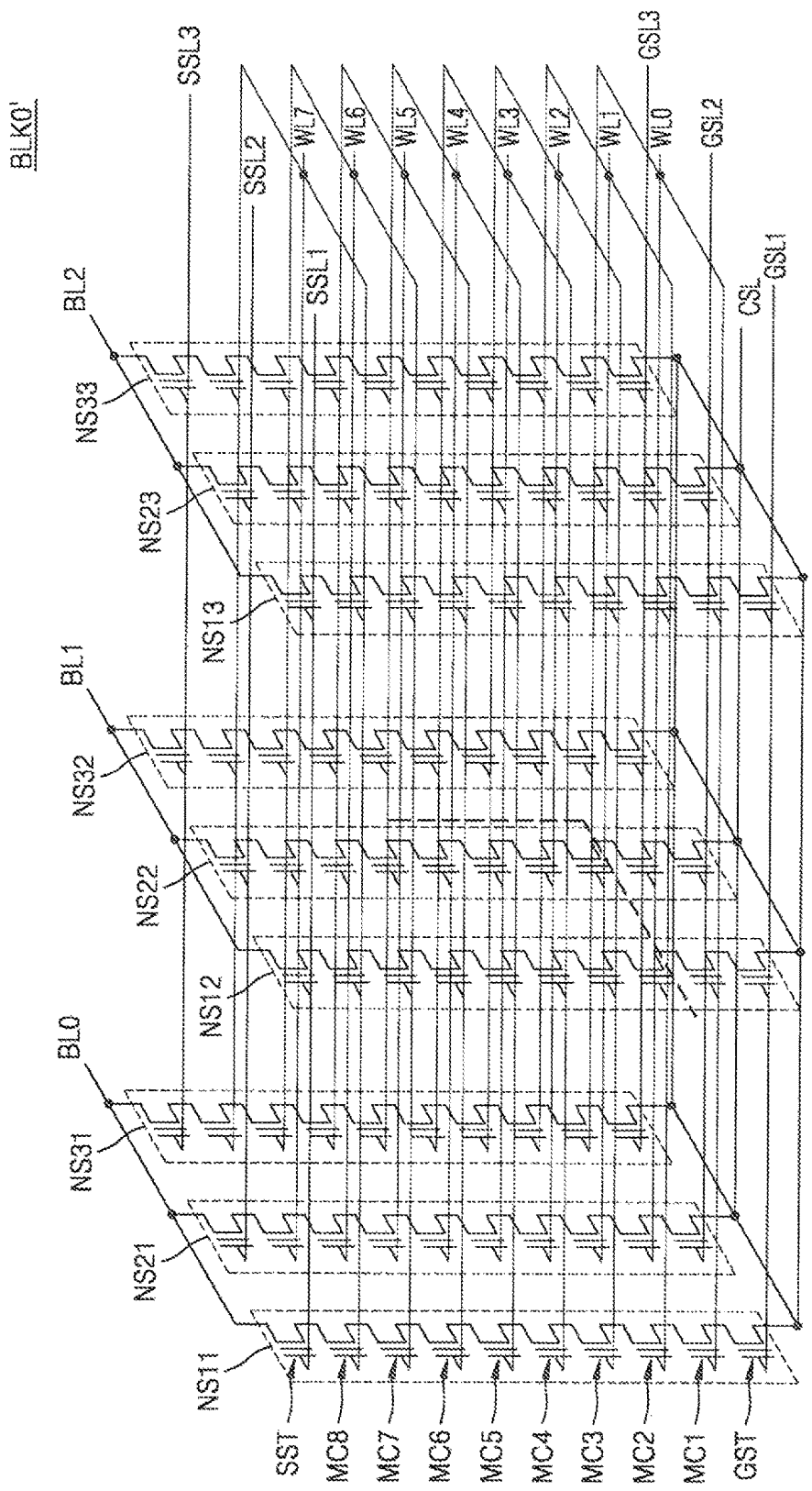
FIG. 8 is a schematic view illustrating a circuit diagram of a memory block included in a memory cell array, according to some embodiments of the inventive concepts.

FIG. 8 is a schematic view illustrating a circuit diagram of a memory block included in a memory cell array, according to some embodiments of the inventive concepts.

Referring to FIG. 8, a memory cell array (for example, the memory cell array 120 of FIG. 1) may be a memory cell array of a vertical NAND flash memory and may include a plurality of memory blocks, including a memory block BLK0'. FIG. 8 illustrates an example in which one memory block BLK0' includes eight word lines WL0 to WL7. Each memory block BLK0' may include a plurality of NAND cell strings NS11 to NS33, the word lines WL0 to WL7, a plurality of bit lines BL0 to BL2, a plurality of ground selection lines GSL1 to GSL3, a plurality of cell string selection lines SSL1 to SSL3, and a common source line CSL. Here, the number of NAND cell strings, the number of word lines, the number of bit lines, the number of ground selection lines, and the number of cell string selection lines may vary according to some embodiments.

The NAND cell strings NS11, NS21, and NS31 may be between the first bit line BL0 and the common source line CSL, the NAND cell strings NS12, NS22, and NS32 may be between the second bit line BL1 and the common source line CSL, and the NAND cell, strings NS13, NS23, and NS33 may be between the third bit line BL2 and the common source line CSL. Each NAND cell string (for example, NS11) may include a cell string selection transistor SST, a plurality of memory cells MC1 to MC8, and a ground selection transistor GST connected in series.

NAND cell strings collectively connected to one bit line may correspond to one column. For example, the NAND cell strings NS11, NS21, and NS31 collectively connected to the first bit line BL0 may correspond to a first column, the NAND cell strings NS12, NS22, and NS32 collectively connected to the second bit line BL1 may correspond to a second column, and the NAND cell strings NS13, NS23, and NS33 collectively connected to the third bit line BL2 may correspond to a third column.

NAND cell strings connected to one cell string selection line may correspond to one row. For example, the NAND cell strings NS11, NS12, and NS13 connected to the first cell string selection line SSL1 may correspond to a first row, the NAND cell strings NS21, NS22, and NS23 connected to the second cell string selection line SSL2 may correspond to a second row, and the NAND cell strings NS31, NS32, and NS33 connected to the third cell string selection line SSL3 may correspond to a third row.

The cell string selection transistor SST may be connected to corresponding cell string selection lines SSL1 to SSL3. The memory cells MC1 to MC8 may be respectively connected to corresponding word lines WL0 to WL7. The ground selection transistor GST may be connected to corresponding ground selection lines GSL1 to GSL3. The cell string selection transistor SST may be connected to corresponding bit lines BL0 to BL2, and the ground selection transistor GST may be connected to the common source line CSL.

Word lines having the same height (for example, WL1) may be connected to each other, the cell string selection lines SSL1 to SSL3 may be separated from each other, and the ground selection lines GSL1 to GSL3 may be separated from each other. For example, when memory cells connected to the first word line WL0 and included in the NAND cell strings NS11, NS12, and NS13 are programmed, the first word line WL0 and the first cell string selection line SSL1 may be selected. some embodiments, the ground selection lines GSL1 to GSL3 may be connected to each other.

Figure 9:
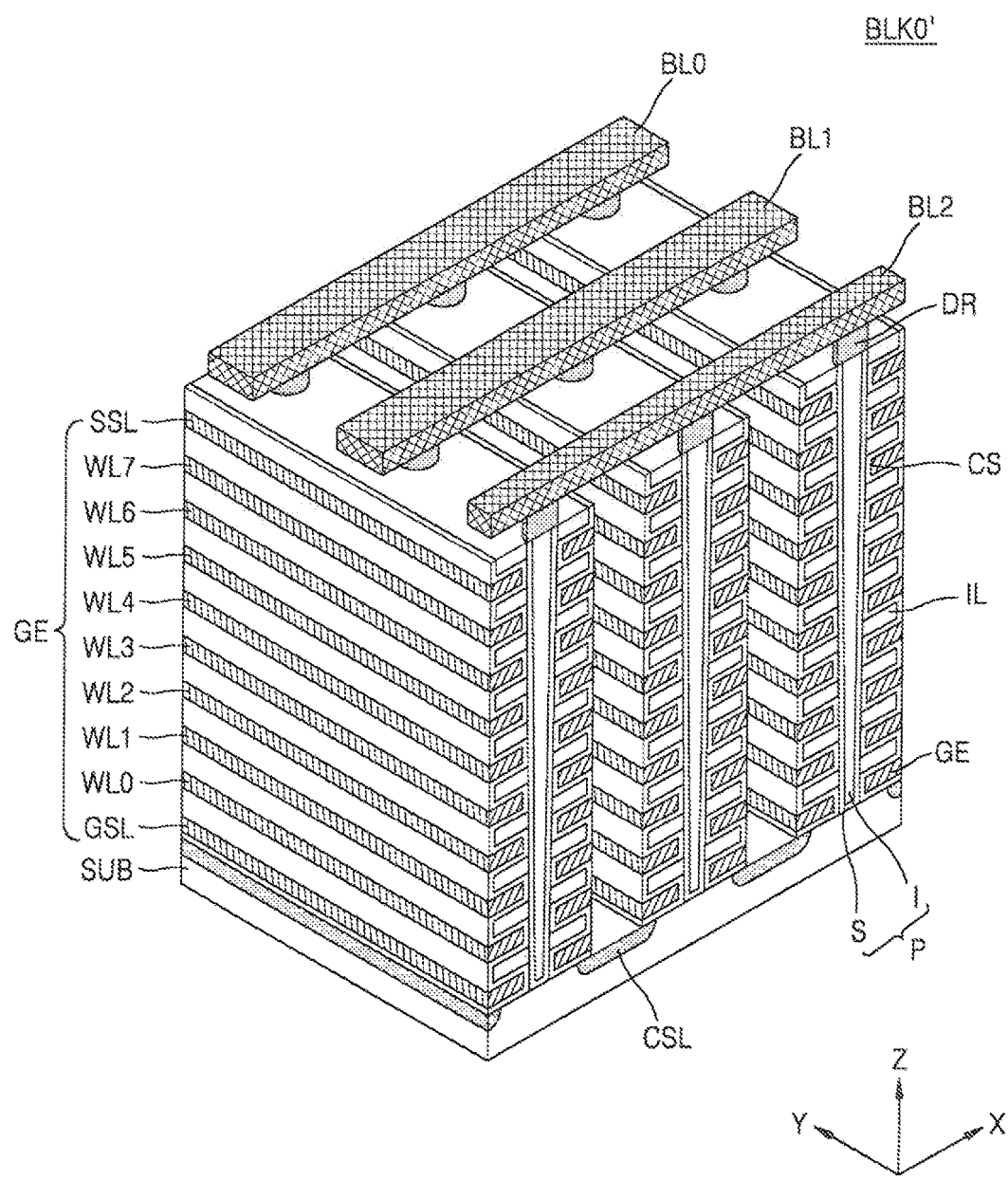
FIG. 9 is a perspective view of the memory block of FIG. 8, according to some embodiments of the inventive concepts.

FIG. 9 is a perspective view of the memory block of FIG. 8, according to some embodiments of the inventive concepts.

Referring to FIG. 9, each memory block BLK0' included in a memory cell array (for example, the memory cell array 120 of FIG. 1) may extend primarily vertically with respect to a substrate SUB. Although it is illustrated in FIG. 9 that a memory block includes two selection lines GSL and SSL, eight word lines WL0 to WL7, and three bit lines BL0 to BL2, in some embodiments the numbers of the lines may be higher or lower.

The substrate SUB may have a first conductivity type (for example, p type), and the common source line CSL doped with an impurity of a second conductivity type (for example, n type) may extend in a first direction (for example, Y direction) on the substrate SUB. A plurality of insulating films IL extending in the first direction may be sequentially arranged and separated by a predetermined distance from each other in a third direction (for example, z direction), over an area of the substrate SUB between two adjacent common source lines. CSL. For example, the insulating films IL may include an insulating material such as silicon oxide.

A plurality of pillars P sequentially arranged in the first direction and passing through the insulating films IL in the third direction may be on an area of the substrate SUB between two adjacent common source lines CSL. For example, the pillars P may contact the substrate SUB by passing through the insulating films IL. Specifically, a surface layer S of each pillar P may include a silicon material of a first type and may play a role as a channel region. Also, an inner layer I of each pillar P may include an insulating material such as silicon oxide or an air gap.

A charge storage layer CS may be along exposed surfaces of the insulating films IL, the pillars P, and the substrate SUB, and on an area of the substrate SUB between two adjacent common source lines CSL. The charge storage layer CS may include a gate insulating layer (also referred to as a 'tunneling insulation layer'), a charge trapping layer, and a blocking insulation layer. For example, the charge storage layer CS may have a structure of oxide-nitride-oxide (ONO). Also, gate electrodes GE such as the selection lines GSL and SSL and the word lines WL0 to WL7 may be on an exposed surface of the charge storage layer CS between two adjacent common source lines CSL.

A drain or a drain contact DR may be on each of the pillars P. For example, the drain or the drain contact DR may include a silicon material doped with an impurity of a second conductivity type. The bit lines BL0 to BL2 may be on the drain contacts DR, extending in a second direction (for example, X direction) and, separated by a predetermined distance from each other in the first direction.

Figure 10:
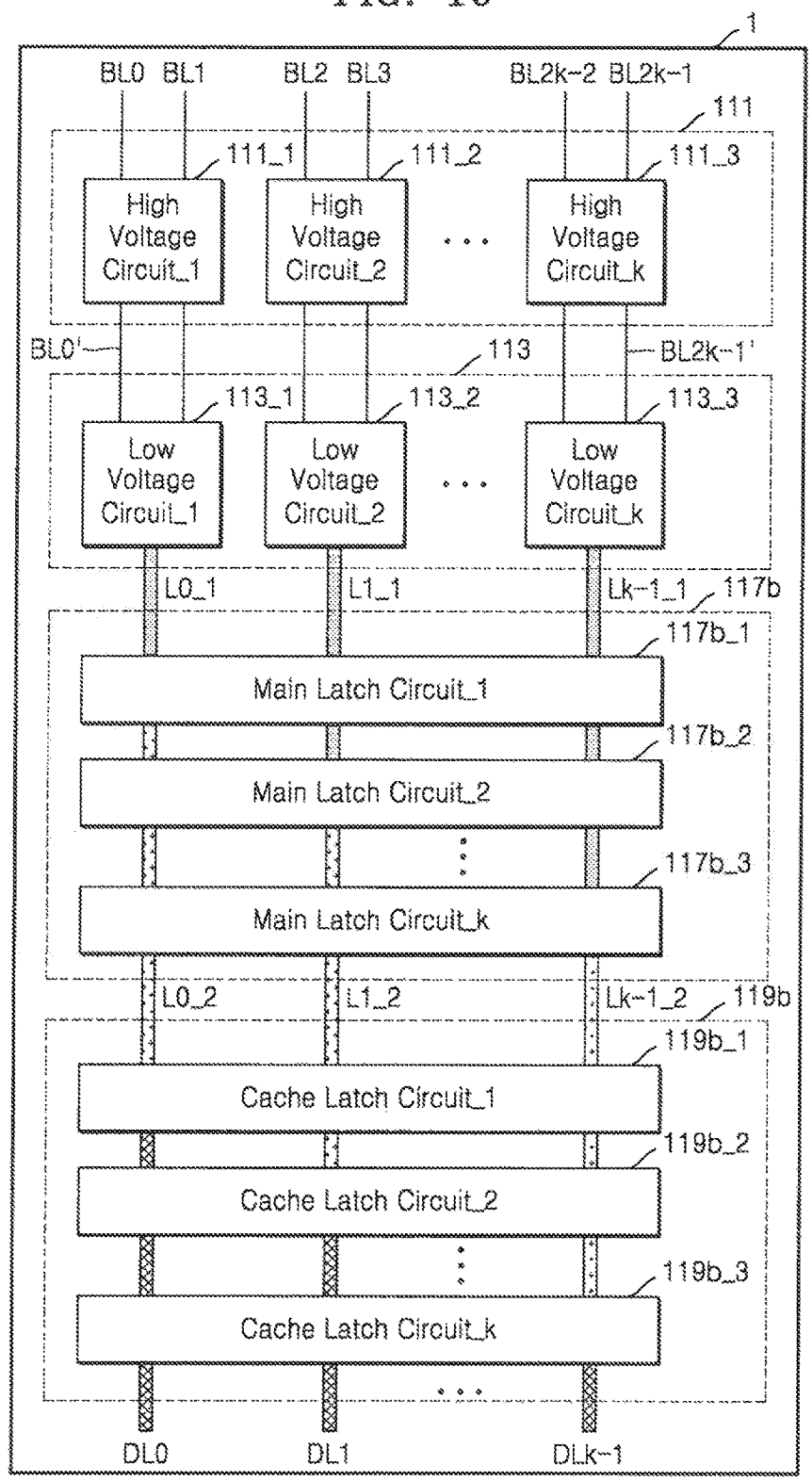
FIG. 10 is a block diagram illustrating a page buffer circuit included in a nonvolatile memory device, according to some embodiments of the inventive concepts.

FIG. 10 is a block diagram illustrating a page buffer circuit included in a nonvolatile memory device according to some, embodiments of the inventive concepts. FIG. 10 illustrates a block diagram showing at least a portion of the page buffer circuit 110 including the page buffers 110_1 to 110_i of FIG. 1. In comparison with the page buffer circuit 110a of FIG. 2, a main latch circuit unit 117b and a cache latch circuit unit 119b may be independently disposed in a page buffer circuit 110b of FIG. 10.

Referring to FIGS. 1 and 10, the page buffer circuit 110b may include the first to kth page buffers 110_1, 110_2, and 110_3. Here, k may be a natural number equal to or greater than 3 and may be a natural number equal to or less than i of FIG. 1. The first, page buffer 110_1 may include the first high-voltage circuit 111_1, the first low-voltage circuit 113_1, a first main latch circuit 117b_1, and a first cache latch circuit 119b_1. The second, page buffer 110_2 may include the second high-voltage circuit 111_2, the second low-voltage circuit 113_2, a second latch circuit 117b_2, and a second cache latch circuit 119b_2, and the kth page buffer 110_3 may include the kth high-voltage circuit 111_3, the kth low-voltage circuit 113_3, a kth main latch circuit 117b_3, and a kth cache latch circuit 119b_3. Each of the first to kth page buffers 110_1, 110_2, and 110_3 may include the first page buffer 110_1 of FIG. 3 or the first page buffer 110_1' of FIG. 6.

The first high-voltage circuit 111_1 of the first page buffer 110_1 may be connected to the first bit line BL0 and the second bit line BL1. The first low-voltage circuit 113_1 may be connected to the first high-voltage circuit 111_1 via the first bit line BL0 and the second bit line BL1. The first low-voltage circuit 113_1 and the first main latch circuit 117b_1 may be connected to each other via a first main connection line L0_1. The first main latch circuit 117b_1 and the first cache latch circuit 119b_1 may be connected to each other via a first sub connection line L0_2. The first cache latch circuit 119b_1 may input and output data via the first data line DL0.

Although it is illustrated in FIG. 10 that each of the first to kth page buffers 110_1, 110_2, and 110_3 is connected to two bit lines, this is a merely an example. Two or more bit lines may be connected to each of the first to kth page buffers 110_1, 110_2, and 110_3.

The first to kth high-voltage circuits 111_1, 111_2, and 111_3 may be included in the high-voltage circuit unit 111, and the first to kth low-voltage circuits 113_1, 113_2, and 113_3 may be included in the low-voltage circuit unit 113. The first to kth main latch circuits 117b_1 117b_2, and 117b_3 may be included in the main latch circuit unit 117b, and the first to kth cache latch circuits 119b_1, 119b_2, and 119b_3 may be included in the cache latch circuit unit 119b.

The high-voltage circuit unit 111, the low-voltage circuit unit 113, the main latch circuit, unit 117b, and the cache latch circuit unit 119b may be sequentially arranged on the main surface of the substrate 1 from a location near the memory cell array 120 in a direction away from the memory cell array 120. The first to kth main latch circuits 117b_1, 117b_2, and 117b_3 and the first to kth cache latch circuits 119b_1, 119b_2, and 119b_3 included in the main latch circuit unit 117b and the cache latch circuit unit 119b may also be arranged on the main surface of the substrate 1 from near the memory cell array 120 in a direction away from the memory cell array 120.

The high-voltage circuit unit 111 may be embodied as a plurality of high-voltage transistors, the low-voltage circuit unit 113 may be embodied as a plurality of low-voltage transistors, and voltage applied to the high-voltage transistors may have a higher range than voltage applied to the low-voltage transistors, In comparison with embodiments in which the first low-voltage circuit 113_1, the first main latch circuit 117b_1, the first cache latch circuit 119b_1, the second low-voltage circuit 113_2, the second latch circuit 117b_2, the second cache latch circuit 119b_2, the kth low-voltage circuit 113_3, the kth main latch circuit 117b_3, and the kth cache latch circuit 119b_3 are sequentially arranged, a nonvolatile memory device according to some embodiments of the inventive concepts may include the low-voltage circuit unit 113 consisting of the first to kth low-voltage circuits 113_1, 113_2, and 113_3 and disposed close to the high-voltage circuit unit 111. Accordingly, the bit lines BL0 to BL2k-1 and the connection bit lines BL0' to BL2k-1' may be connected up to the low-voltage circuit unit 113, and a plurality of main connection lines L0_1 to Lk-1_1 connecting the low-voltage circuit unit 113 and the main latch circuit unit 117b and a plurality of sub connection lines L0_2 to Lk-1_2 connecting the main latch circuit unit 117b and the cache latch circuit unit 119b may be independently formed.

Even when the bit lines BL0 to BL2k-1 connected to a plurality of memory cells included in a memory cell array have a relatively small width, the main connection lines L0_1 to Lk-1_1 and the sub connection lines L0_2 to Lk-1_2 may each have a width greater than the width of the bit lines BL0 to BL2k-1. The data lines DL0 to DLk-1 formed together with the sub connection lines L0_2 to Lk-1_2 may also each have a width greater than the width of the bit lines BL0 to BL2k-1. Thus, a load to the data lines DL0 to DLk-1 may be reduced, and since a dump time is reduced, an operation performance of the page buffer circuit 110b may be improved. In addition, the main connection lines L0_1 to Lk-1_1, the sub connection lines L0_2 to Lk-1_2, and the data lines DL0 to DLk-1 may be easily formed.

Figure 11:
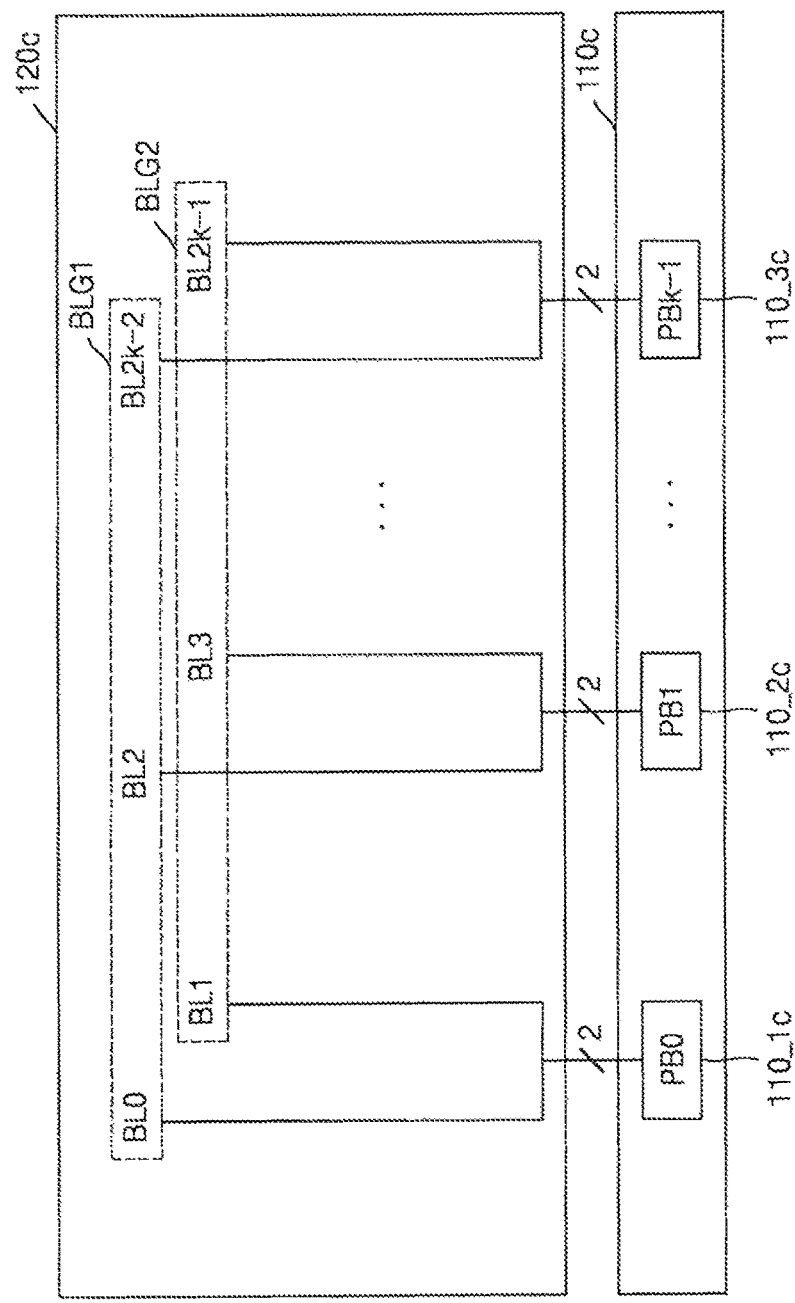
FIG. 11 is a block diagram illustrating a portion of a nonvolatile memory device including a page buffer circuit having a shielded bit line (SBL) structure, according to some embodiments of the inventive concepts.

FIG. 11 is a block diagram illustrating a portion of a nonvolatile memory device including a page buffer circuit having a shielded bit line (SBL) structure, according to some embodiments of the inventive concepts. The page buffer circuit 110c of FIG. 11 may correspond to at least a portion of the page buffer circuit 110 of FIG. 1, and a memory cell array 120c may correspond to at least a portion of the memory cell array 120 of FIG. 1. FIG. 11 illustrates an operation of a plurality of page buffer circuits included the page buffer circuit 110a of FIG. 2 and the page buffer circuit 110b of FIG. 10.

Referring to FIG. 11, the memory cell array 120c may be connected to the bit lines BL0 to BL2k-1. Here, k may be a natural number equal to or greater than 3 and may be a natural number equal to or less than i of FIG. 1. The page buffer circuit 110c may include a plurality of page buffers 110_1c to 110_3e. In some embodiments, the number of the page buffers 110_1c to 110_3c may be k, and, the number of the bit lines BL0 to BL2k-1 may be 2k. In some embodiments, two bit lines (for example, BL0 and BL1) may be connected to one page buffer (for example, 110_1), and thus, the page buffer circuit 1100 may be referred to as a page buffer circuit having an SBL structure. The page buffer circuit 110c may include the page buffer circuit 110a of FIG. 2 or the page buffer circuit 110b of FIG. 10.

In some embodiments, the bit lines BL0 to BL2k-1 may be divided into a first and second bit line groups BLG1 and BLG2, and read orders of the first and second bit line groups BLG1 and BLG2 may be different from each other. For example, the first bit line group BLG1 may include bit lines BL0 and BL2 to BL2k-2, and the second bit line group BLG2 may include bit lines BL1 and BL3 to BL2k-1. For example, the first and second bit lines BL0 and BL1 that are respectively included in the first and second bit line groups BLG1 and BLG2 may share a page buffer 110_1c. Here, read operations for the first and second bit line groups BLG1 and BLG2 may be sequentially performed, that is, read operations for memory cells connected to the first and second bit lines BL0 and BL1 may be sequentially performed.

Figure 12:
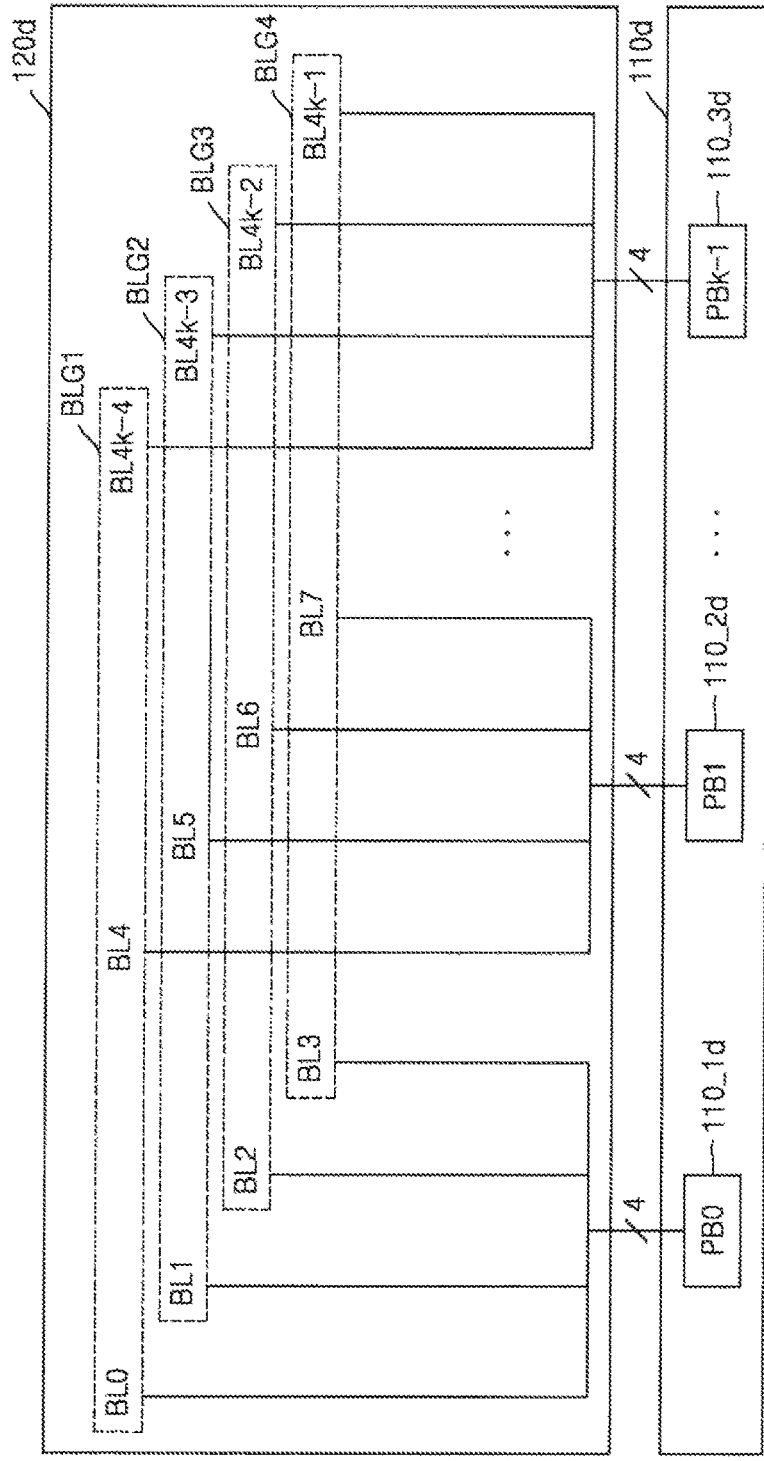
FIG. 12 is a block diagram illustrating a portion of a nonvolatile memory device including, a page buffer circuit having a Quadruple Bit Line (QBL) structure, according to some embodiments of the inventive concepts.

FIG. 12 is a block diagram illustrating a portion of a nonvolatile memory device including a page buffer circuit having a Quadruple Bit Line (QBL) structure, according to some embodiments of the inventive concepts. The page buffer circuit 110d of FIG. 12 may correspond to at least a portion of the page buffer circuit 110 of FIG. 1, and a memory cell array 120d may correspond to at least a portion of the memory cell array 120 of FIG. 1. FIG. 12 illustrates an operation of a plurality of page buffer circuits included in the page buffer circuit 110a of FIG. 2 and the page buffer circuit 110b of FIG. 10.

Referring to FIG. 12, the memory cell array 120d may be connected to a plurality of bit lines BL0 to BL4k-1. Here, k may be a natural number equal to or greater than 3 and may be a natural number equal to or less than i FIG. 1. The page buffer circuit 110d may include a plurality of page buffers 110_d to 110_3d. In some embodiments, the number of the page buffers 110_1d to 110_3d may be k, and the number of the bit lines BL0 to BL4k-1 may be 4k. In some embodiments, four bit lines (e.g., BL0 to BL3) may be connected to one page buffer (e.g., 110_1d), and thus, the page buffer circuit 110d may be referred to as a page buffer circuit having a QBL structure. The page buffer circuit 110d may include the page buffer circuit 110a of FIG. 2 or the page buffer circuit 110b of FIG. 10.

In some embodiments, the bit lines BL0 to BL4k-1 may be divided into first to fourth bit line groups BLG1 to BLG4, and read orders of the first to fourth bit line groups BLG1 to BLG4 may be different from each other. For example, the first bit line group BLG1 may include bit lines BL0 and BL4 to BL4k-4, the second bit line group BLG2 may include bit lines BL1 and BL5 to BL4k-3, the third bit line groups BLG3 may include bit lines BL2 and BL6 to BL4k-2, and the fourth bit line group BLG4 may include bit lines BL3 and BL7 to BL4k-1.

For example, the first to fourth bit lines BL0 to BL3 respectively included in the first to fourth bit line groups BLG1 to BLG4 may share a page buffer 110_1d. Here, read operations for the first to fourth bit line groups BLG1 to BLG4 may be sequentially performed, that is, read operations for memory cells connected to the first to fourth bit lines BL0 to BL4 may be sequentially performed.

FIGS. 11 and 12 illustrate embodiments in which two or four bit lines are connected to one page buffer, however embodiments are not limited thereto. Four or more bit lines may be configured to be connected to one page buffer in some embodiments of the inventive concepts.

As illustrated in embodiments described in FIGS. 11 and 12, if the bit lines BL0 to BL2k-1 are respectively divided into the first and second bit line groups BLG1 and BLG2 to perform an operation, interference between adjacent bit lines may be prevented. Also, a page buffer may not, be connected to each bit line, and thus, an area of a page buffer circuit may be reduced to increase integration of a nonvolatile memory device.

Figure 13:
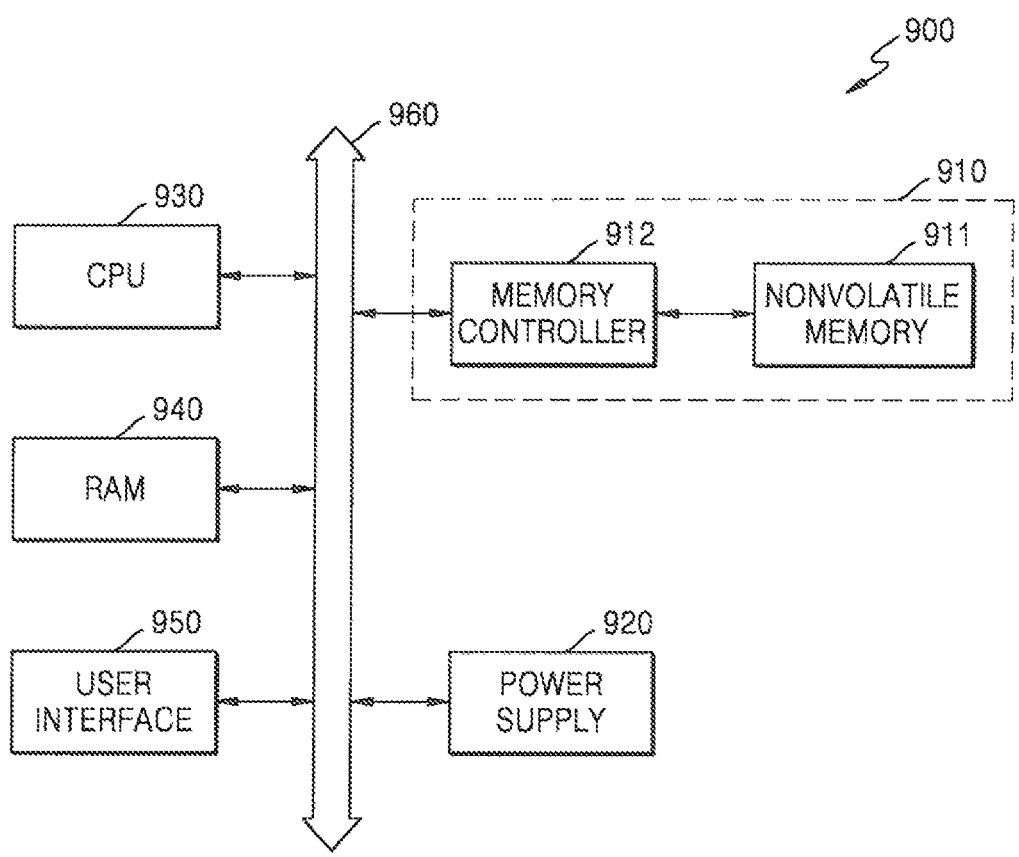
FIG. 13 is a block diagram illustrating a diagram of a computing system including a nonvolatile memory device, according to some embodiments of the inventive concepts.

FIG. 13 is a block diagram illustrating a diagram of a computing system including a nonvolatile memory device, according to some embodiments of the inventive concepts.

Referring to FIG. 13, a computing system device 900 may include a CPU 930 electrically connected to a bus 960, a user interface 950, and a nonvolatile memory system 910 including a memory controller 912 and a nonvolatile memory device 911. The nonvolatile memory device 911 may include a nonvolatile memory device including the page buffer circuits 110, 110a, 110b, 110c, and 110d of FIGS. 1 to 12. Thus, the computing system device 900 may reduce time taken to read data stored in the nonvolatile memory device 911, and secure accuracy of data. The computing system device 900 may further include a RAM 940 and a power supply 920.

When the computing system device 900 is a mobile device, a modem such as a battery and a baseband chipset may be further provided to supply an operating voltage to a computing system. Also, the computing system device 900 may further include any of an application chipset, a camera image processor (CIS), and a mobile DRAM.

The memory controller 912 and the nonvolatile memory device 911 may constitute, for example, a Solid State Drive/Disk (SSD) including a nonvolatile memory for storing data.

While the inventive concepts has been particularly shown and described with reference to some embodiments thereof, it will be understood that various changes in form and details may be made therein without departing from the spirit and scope of the following claims.

What is claimed is:

1. A nonvolatile memory device comprising:
    a memory cell array;
    a first page buffer connected to the memory cell array via a first plurality of bit lines, the first page buffer comprising:
        a first high-voltage circuit comprising a first bit line selection circuit connected to the first plurality of bit lines;
        a first bit line shut-off circuit connected to the first plurality of bit lines via the first bit line selection circuit; and
        a first latch circuit configured to input and output data via a first data line; and
    a second page buffer connected to the memory cell array via a second plurality of bit lines, the second page buffer comprising;
        a second high-voltage circuit comprising a second bit line selection circuit connected to the second plurality of bit lines;
        a second bit line shut-off circuit connected to the second plurality of bit lines via the second bit line selection circuit; and
        a second latch circuit configured to input and output data via a second data line,
    wherein the first bit line selection circuit and the second bit line selection circuit are on a first region of a main surface of a substrate, the first bit line shut-off circuit and the second bit line shut-off circuit are on a second region of the main surface of the substrate, and the first latch circuit and the second latch circuit are on a third region of the main surface of the substrate,
    wherein the first region, the second region, and the third region are sequentially arranged on the main surface of the substrate in a direction away from the memory cell array, and
    wherein a width of the first data line and a width of the second data line are each greater than a width of each of the first plurality of bit lines and a width of each of the second plurality of bit lines.

2. The nonvolatile memory device of claim 1, further comprising:
    a plurality of layers on the substrate,
    wherein the first data line and the second data line are connected to the first latch circuit and the second latch circuit, respectively, on a first layer of the plurality of layers.

3. The nonvolatile memory device of claim 2, wherein the first plurality of bit lines and the second plurality of bit lines are on the first layer.

4. The nonvolatile memory device of claim 1,
    wherein the first page buffer further comprises a first discharge circuit that is configured to discharge the first plurality of bit lines, the first discharge circuit being between the first bit line selection circuit and the first latch circuit, and
    wherein the second page buffer further comprises a second discharge circuit that is configured to discharge the second plurality of bit lines, the second discharge circuit being between the second bit line selection circuit and the second latch circuit in the direction away from the memory cell array.

5. The nonvolatile memory device of claim 4,
    wherein the first discharge circuit comprises a first discharge transistor comprising a first discharge transistor gate line,
    wherein the second discharge circuit comprises a second discharge transistor comprising a second discharge transistor gate line,
    wherein the first bit line selection circuit comprises a first selection transistor comprising a first selection transistor gate line,
    wherein the second bit line selection circuit comprises a second selection transistor comprising a second selection transistor gate line, and wherein a thickness of the first discharge transistor gate line and a thickness of the second discharge transistor gate line are each less than a thickness of the first selection transistor gate line and a thickness of the second selection transistor gate line.

6. The nonvolatile memory device of claim 1,
wherein the first latch circuit comprises a first main latch and a first cache latch,
wherein the second latch circuit comprises a second main latch and a second cache latch, and
wherein the first main latch, the first cache latch, the second main latch, and the second cache latch are sequentially arranged on the main surface of the substrate in the direction away from the memory cell array.

7. The nonvolatile memory device of claim 1,
wherein the first latch circuit comprises a first data latch and a first cache latch,
wherein the second latch circuit comprises a second data latch and a second cache latch, and
wherein the first data latch, the second data latch, the first cache latch, and the second cache latch are sequentially arranged on the main surface of the substrate in the direction away from the memory cell array.

8. A nonvolatile memory device comprising:
a memory cell array;
a first page buffer connected to the memory cell array via a first plurality of bit lines, the first page buffer comprising a first high-voltage circuit connected to the first plurality of bit lines, a first low-voltage circuit connected to the first plurality of bit lines via the first high-voltage circuit, and a first latch circuit configured to input and output data via a first data line; and
a second page buffer connected to the memory cell array via a second plurality of bit lines, the second page buffer comprising a second high-voltage circuit connected to the second plurality of bit lines, a second low-voltage circuit connected to the second plurality of bit lines via the second high-voltage circuit, and a second latch circuit configured to input and output data via a second data line,
wherein the first high-voltage circuit and the second high-voltage circuit are on a first region of a main surface of a substrate, the first low-voltage circuit and the second low-voltage circuit are on a second region of the main surface of the substrate, and the first latch circuit and the second latch circuit are on a third region of the main surface of the substrate,
wherein the first region, the second region, and the third region are sequentially arranged on the main surface of the substrate in a direction away from the memory cell array, and
wherein the first high-voltage circuit and the second high-voltage circuit are configured to receive respective voltages comprising higher ranges than voltages that the first low-voltage circuit and the second low-voltage circuit are configured to receive.

9. The nonvolatile memory device of claim 8,
wherein a width of the first data line and a width of the second data line are each greater than a width of each of the first plurality of bit lines and a width of each of the second plurality of bit lines.

10. The nonvolatile memory device of claim 8,
wherein the first plurality of bit lines comprise a first bit line of a first bit line group and a second bit line of a second bit line group,
wherein the second plurality of bit lines comprise a third bit line of the first bit line group and a fourth bit line of the second bit line group,
wherein the first page buffer is connected to the first bit line of the first bit line group and the second bit line of the second bit line group, and
wherein the second page buffer is connected to the third bit line of the first bit line group and the fourth bit line of the second bit line group.

11. The nonvolatile memory device of claim 8,
wherein the first high-voltage circuit comprises a plurality of selection transistors connected to respective ones of the first plurality of bit lines, and
wherein the first low-voltage circuit comprises a shut-off transistor configured to perform a shut-off operation of at least one of the first plurality of bit lines.

12. The nonvolatile memory device of claim 8, wherein the first low-voltage circuit comprises a plurality of discharge transistors that are configured to discharge respective ones of the first plurality of bit lines.

13. The nonvolatile memory device of claim 8, wherein the first high-voltage circuit comprises a plurality of discharge transistors that are configured to discharge respective ones of the first plurality of bit lines.

14. The nonvolatile memory device of claim 8, wherein the first low-voltage circuit is configured to transmit an output signal to the first latch circuit via a sensing node.

15. A nonvolatile memory device comprising:
a memory cell array; and
a page buffer circuit including a plurality of high-voltage circuits, a plurality of low-voltage circuits, and a plurality of latch circuits on a substrate,
wherein the substrate includes a high-voltage region in which the high-voltage circuits are arranged, a low-voltage region in which the low-voltage circuits are arranged, and latch region in which the latch circuits are arranged,
wherein the high-voltage region, the low-voltage region, and the latch region are sequentially arranged on a main surface of the substrate in a direction away from the memory cell array,
wherein a plurality of bit line patterns are formed on the high-voltage region and the low-voltage region,
wherein a plurality of data line patterns are formed on the high-voltage region and the latch region, and
wherein widths of the plurality of data line patterns are greater than widths of the bit line patterns.

16. The nonvolatile memory device of claim 15, wherein the plurality of bit line patterns and the plurality of data line patterns are formed in a single layer of the substrate.

17. The nonvolatile memory device of claim 15,
wherein a plurality of gate patterns are formed on the high-voltage region, a plurality of gate patterns are formed on the low-voltage region, and widths of the gate patterns in the high-voltage region are greater than widths of the gate patterns in the low-voltage region, respectively.

18. The nonvolatile memory device of claim 15,
wherein each of the plurality of high-voltage circuits comprises a first bit line selection transistor and a second bit line selection transistor, the first bit line selection transistor being electrically connected to the memory cell array via a first bit line pattern of the plurality of bit line patterns and the second bit line selection transistor being electrically connected to the memory cell array via a second bit line pattern of the plurality of bit line patterns, wherein each of the plurality of low-voltage circuits comprises a first shut-off transistor and a second shut-off transistor, the first shut-off transistor electrically connecting the first bit line selection transistor and a sensing nod, and the second shut-off transistor electrically connecting the second bit line selection transistor and a sensing node.

19. The nonvolatile memory device of claim 18, wherein a first width of a first active pattern of the first bit line selection transistor is greater than a second width of a second active pattern of the first shut-off transistor,
wherein a first thickness of a first gate line pattern of the first bit line selection transistor is greater than a second thickness of a second gate line pattern of the first shut-off transistor, and
wherein a third thickness of a first insulating layer between the first gate line pattern and the first active pattern is greater than a fourth thickness of a second insulating layer between the second gate line pattern and the second active pattern.

20. The nonvolatile memory device of claim 15, wherein each of the plurality of high-voltage circuits comprises a first bit line selection transistor and a second bit line selection transistor, the first bit line selection transistor being electrically connected to the memory cell array via a first bit line pattern of the plurality of bit line patterns and the second bit line selection transistor being electrically connected to the memory cell array via a second bit line pattern of the plurality of bit line patterns,
wherein each of the plurality of low-voltage circuits comprises a shut-off transistor, the shut-off transistor electrically connecting the first bit line selection transistor and a sensing nod, and the second bit line selection transistor and a sensing node.

* * * * *